(12) United States Patent
Yamashita et al.

(10) Patent No.: US 12,187,011 B2
(45) Date of Patent: Jan. 7, 2025

(54) RESIN MOLDED PRODUCT AND MANUFACTURING METHOD THEREOF, AND WAVELENGTH CONVERSION MEMBER AND ILLUMINATION MEMBER

(71) Applicant: NS MATERIALS INC., Fukuoka (JP)

(72) Inventors: Kazuyuki Yamashita, Fukuoka (JP); Eiichi Kanaumi, Fukuoka (JP); Akiharu Miyanaga, Fukuoka (JP)

(73) Assignee: TOPPAN INC., Tokyo (JP)

( * ) Notice: Subject to any disclaimer, the term of this patent is extended or adjusted under 35 U.S.C. 154(b) by 141 days.

(21) Appl. No.: 16/256,254

(22) Filed: Jan. 24, 2019

(65) Prior Publication Data
US 2019/0157516 A1    May 23, 2019

Related U.S. Application Data

(62) Division of application No. 15/501,018, filed as application No. PCT/JP2015/071838 on Jul. 31, 2015, now abandoned.

(30) Foreign Application Priority Data

Aug. 6, 2014  (JP) ................. 2014-160299

(51) Int. Cl.
*B32B 27/00*    (2006.01)
*C09K 11/02*    (2006.01)
*H01L 33/50*    (2010.01)

(52) U.S. Cl.
CPC .............. *B32B 27/00* (2013.01); *C09K 11/02* (2013.01); *H01L 33/50* (2013.01); *H01L 2224/48091* (2013.01); *H01L 2924/181* (2013.01)

(58) Field of Classification Search
CPC .......... B32B 27/00; C09K 11/02; H01L 33/50; H01L 2924/181; H01L 2224/48091; C08J 7/04; C08K 5/098
See application file for complete search history.

(56) References Cited

U.S. PATENT DOCUMENTS 2,710,291 A    6/1955  Little
2001/0044508 A1*  11/2001  Loveday ............... C08F 10/02
                                                    526/113
(Continued)

FOREIGN PATENT DOCUMENTS

CN       101666952       5/2013
JP       2008-130279     6/2008
(Continued)

OTHER PUBLICATIONS

Japanese Office Action for JP App. No. 2016-507933 dated Feb. 20, 2018.
(Continued)

*Primary Examiner* — Ratisha Mehta
(74) *Attorney, Agent, or Firm* — Greenblum and Bernstein, P.L.C.

(57) ABSTRACT

A resin molded product is provided and capable of increasing a degree of freedom of a shape compared to prior arts, further provided with increased durability against environmental changes and improved reliability, a manufacturing method thereof, and a wavelength conversion member and an illumination member. The resin molded product is implemented by molding resin in which quantum dots are dispersed. The resin preferably contains a dispersant composed of metal soap. For example, a wavelength conversion bar (fluorescent bar) interposed between a light-emitting device such as an LED and a light-guiding board is molded using quantum-dot-containing resin.

13 Claims, 21 Drawing Sheets

(56) References Cited

U.S. PATENT DOCUMENTS

| | | | |
|---|---|---|---|
| 2003/0066998 A1* | 4/2003 | Lee | G02B 6/122 257/19 |
| 2009/0109388 A1* | 4/2009 | Takahashi | G02F 1/13394 349/126 |
| 2010/0045902 A1* | 2/2010 | Ikeda | G02B 5/045 359/485.06 |
| 2010/0051898 A1 | 5/2010 | Kim et al. | |
| 2011/0068321 A1 | 3/2011 | Pickett et al. | |
| 2011/0301268 A1 | 12/2011 | Oobayashi | |
| 2013/0075692 A1 | 3/2013 | Naasani et al. | |
| 2013/0099213 A1 | 4/2013 | Jun et al. | |
| 2013/0143829 A1* | 6/2013 | Holmes | A61K 36/287 514/30 |
| 2013/0189803 A1 | 7/2013 | Nasaani et al. | |
| 2013/0249357 A1* | 9/2013 | Luo | C08K 5/372 312/223.1 |
| 2013/0334557 A1* | 12/2013 | Uchida | H01L 23/564 257/98 |
| 2014/0049155 A1* | 2/2014 | Kurtin | H01L 33/502 313/512 |
| 2014/0160727 A1 | 6/2014 | Hyun | |
| 2014/0183575 A1 | 7/2014 | Miyata | |
| 2014/0284549 A1 | 9/2014 | Liu et al. | |
| 2015/0129018 A1 | 5/2015 | Declerck et al. | |
| 2015/0203747 A1* | 7/2015 | Haley | H01L 33/502 257/98 |
| 2017/0096538 A1* | 4/2017 | Sasaki | C09D 7/40 |

FOREIGN PATENT DOCUMENTS

| | | | | |
|---|---|---|---|---|
| JP | 2013-505346 | 2/2013 | | |
| JP | 2013-079330 | 5/2013 | | |
| JP | 2013-209566 | 10/2013 | | |
| JP | 2013-544018 | 12/2013 | | |
| JP | 2014-130959 | 7/2014 | | |
| TW | 201238756 | 10/2012 | | |
| TW | 201305673 | 2/2013 | | |
| WO | WO2011/036446 | 3/2011 | | |
| WO | WO 2011163024 A2 * | 12/2011 | | H01L 31/0203 |
| WO | WO2012/064562 | 5/2012 | | |
| WO | 2012/102107 | 8/2012 | | |
| WO | 2012/134992 | 10/2012 | | |
| WO | WO-2012134992 A2 * | 10/2012 | | B32B 17/10669 |
| WO | 2013/078252 | 5/2013 | | |
| WO | WO-2013078252 A1 * | 5/2013 | | C09K 11/02 |
| WO | 2013/108125 | 7/2013 | | |
| WO | WO2013/171610 | 11/2013 | | |
| WO | WO-2014104079 A1 * | 7/2014 | | H01L 33/507 |
| WO | WO-2014129067 A1 * | 8/2014 | | C09K 11/565 |

OTHER PUBLICATIONS

Extended European Search Report for EP 15829267.2 having a mailing date of Mar. 13, 2018.

Japanese Office Action for JP App. No. 2016-507933 dated Aug. 1, 2017, along with English-language translation thereof.

International Search Report issued in International Patent Application No. PCT/JP2015/071838, dated Oct. 20, 2015, along with English-language translation.

Taiwanese Office Action for TW Application No. 107142941 dated Jul. 3, 2019.

Japanese Office Action for JP Application No. 2018-081527, dated Jul. 16, 2013.

* cited by examiner

RESIN MOLDED PRODUCT AND MANUFACTURING METHOD THEREOF, AND WAVELENGTH CONVERSION MEMBER AND ILLUMINATION MEMBER

CROSS-REFERENCE TO RELATED APPLICATIONS

The present application is a Divisional of U.S. application Ser. No. 15/501,018, filed Feb. 1, 2017, which is a National stage of International Patent Application No. PCT/JP2015/071838, filed Jul. 31, 2015, which claims priority to Japanese Application No. 2014-160299, filed Aug. 6, 2014. The disclosures of application Ser. No. 15/501,018 and International Patent Application No. PCT/JP2015/071838 are incorporated by reference herein in their entireties.

TECHNICAL FIELD

The present invention relates to a resin molded product in which quantum dots are dispersed in resin, a manufacturing method thereof, and a wavelength conversion member and, in addition, an illumination member using the resin molded product.

BACKGROUND ART

A quantum dot is a nanoparticle composed of several hundreds to several thousands of semiconductor atoms, having a particle diameter on the order of several nm to several tens of nm, and forms a quantum well structure. The quantum dot is also called a "nanocrystal."

A peak light emission wavelength of the quantum dot can be changed in various ways according to the particle diameter or a composition of crystal, and, for example, Patent Literature 1 describes a wavelength conversion layer containing quantum dots formed on a light-guiding board by directly applying it.

CITATION LIST

Patent Literature

Patent Literature 1
Japanese Patent Application Laid-Open No. 2008-130279

SUMMARY OF INVENTION

Technical Problem

Thus, conventionally, layers containing quantum dots are applied or potted onto a surface requiring wavelength conversion. This prevents layers containing quantum dots from being formed into a free shape, resulting in poor practicality.

Furthermore, Patent Literature 1 has no description about means for dispersing quantum dots in resin.

In addition, it is necessary to enhance durability against environmental changes of quantum dots and improve reliability, but prior arts do not mention the durability and have established neither internal configuration of resin nor manufacturing method thereof in order to improve the reliability.

The present invention has been implemented in view of the above-described problems and it is an object of the present invention to provide a resin molded product which can increase the degree of freedom of shape, enhance durability against environmental changes and improve reliability, a manufacturing method thereof, and a wavelength conversion member and an illumination member.

Solution to Problem

The resin molded product according to the present invention has a feature of being formed of resin containing dispersed quantum dots.

In the present invention, the resin preferably contains a dispersant made of metal soap.

Furthermore, in the present invention, the metal soap is preferably made of calcium stearate. Furthermore, 1 ppm to 40,000 ppm of the metal soap is preferably contained in the resin.

In the present invention, it is preferable that a plurality of the quantum dots preferably constitute an aggregate, and the aggregate is preferably dispersed. In this case, not more than several hundreds of the aggregates are preferably included within a square of 500 nm. Furthermore, the aggregate is preferably formed by aggregating not more than several hundreds of quantum dots.

The present invention preferably includes a resin layer in which the quantum dots are contained in resin and a coating layer that coats the surface of the resin layer.

In the present invention, the resin preferably contains a scattering agent.

The wavelength conversion member of the present invention is formed of the above-described resin molded product. Furthermore, the illumination member of the present invention is formed of the above-described resin molded product.

Furthermore, the method for manufacturing the resin molded product of the present invention is molding a resin composition obtained by dispersing quantum dots in resin.

In the present invention, it is preferable to mold the resin composition which is obtained by mixing the resin and metal soap into a quantum dot liquid in which the quantum dots are dispersed in a solvent.

In the present invention, calcium stearate is preferably used for the metal soap. In the present invention, organosilane or hexane is preferably used for the solvent.

In the present invention, a scattering agent is preferably mixed into the quantum dot liquid. In the present invention, it is preferable to apply extrusion molding to the resin molded product, create pellets and perform injection molding using the pellets.

Advantageous Effects of Invention

According to the resin molded product and the manufacturing method thereof according to the present invention, it is possible to enhance the degree of freedom of shape. It is further possible to increase dispersibility of quantum dots, easily maintain a light emission characteristic for a long period of time and improve durability against environmental changes.

Furthermore, according to the present invention, it is possible to form a wavelength conversion member and an illumination member with excellent reliability using the resin molded product containing quantum dots.

DESCRIPTION OF EMBODIMENTS

Figure 1:
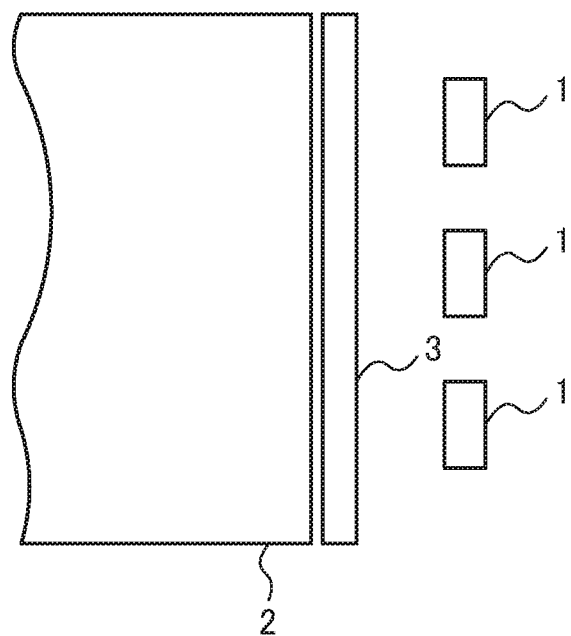
FIG. 1 is a partial plan view illustrating an application example using a resin molded product of the present embodiment.

Hereinafter, embodiments of the present invention will be described in detail. A resin molded product according to the present embodiment is configured by molding resin on which many quantum dots are dispersed.

The quantum dots of the present embodiment can each include a core of semiconductor particles and a shell that coats the perimeter of the core. For example, CdSe is used for the core, but the material thereof is not particularly limited. For example, a core material containing at least Zn and Cd, a core material containing Zn, Cd, Se and S, or a composite of some of ZnCuInS, CdS, CdSe, ZnS, ZnSe, InP and CdTe can be used.

The shell protects the core as a fluorescence section. Quantum efficiency improves by removing surface defects or dangling bond of the core. As an example, a bandgap of the shell is greater than a bandgap of the core, but the bandgap is not limited to this.

The shell may have a so-called multi-shell structure including a first shell (shell I) that coats the surface of the core and a second shell (shell II) that coats the surface of the first shell. In this case, for example, the bandgap of the second shell is greater than the bandgap of the first shell, but the bandgap is not limited to this.

The quantum dots according to the present embodiment may be composed of only cores without any shells being formed. That is, the quantum dots may not be provided with any coating structure with shells as long as the quantum dots are provided with at least cores. For example, when the cores are coated with shells, a region having a coating structure may be small or a coating portion may be too thin to analyze or check the coating structure. Therefore, it is possible to determine quantum dots by an analysis regardless of the presence/absence of the shells.

In the present embodiment, metal soap is preferably included as a dispersant to appropriately disperse many quantum dots in the resin of the resin molded product. Thus, it is possible to effectively enhance the dispersibility in the resin of quantum dots in the resin molded product.

The metal soap is made of minute particles, exhibits excellent dispersibility with respect to quantum dots which are inorganic substances and adds sufficient smoothness to resin.

Fatty acid such as stearic acid, oleic acid, ricinoleic acid, octylic acid, lauric acid or metal such as lithium, magnesium, calcium, barium, zinc is used for the metal soap. Among them, the metal soap is preferably calcium stearate.

In the present embodiment, the metal soap contained in resin preferably falls within a range of 1 ppm to 40,000 ppm by weight with respect to the resin. This makes it possible to increase dispersibility or smoothness and also prevents turbidity or surface irregularity or the like on the resin surface. The weight ratio of the metal soap to the quantum dots contained is 1/10 (1:10) to 10 (10:1). The quantum dots are suitably on the order of 10 ppm to 4,000 ppm by weight with respect to the resin. Therefore, the metal soap is suitably 1 ppm to 40,000 ppm by weight with respect to the resin.

Thus, the Applicant has discovered that when the metal soap (especially, calcium stearate) is introduced, the metal soap wraps the quantum dots and thereby improves dispersibility.

Furthermore, in the present embodiment, the resin preferably contains elastomer. For example, when polypropylene (PP) is selected as resin, transparency can be improved by mixing elastomer. In this case, elastomer highly compatible with polypropylene resin is preferable.

In the present embodiment, the resin preferably contains a scattering agent. Addition of the scattering agent can improve a light emission characteristic. Minute particles such as silica ($SiO_2$), BN, AlN can be presented as the scattering agent.

The resin molded product according to the present embodiment may be configured so as to include a resin layer in which quantum dots are contained in the resin and a coating layer that coats the surface of the resin. Glass coating, epoxy coating, diamond-like carbon (DLC) or the like can be presented as the coating layer. This makes it possible to improve durability with respect to water content in the atmosphere and thereby provide high reliability.

Although the resin constituting the resin molded product is not particularly limited, it is possible to use polypropylene, polyethylene, polystyrene, AS resin, ABS resin, methacryl resin, polyvinyl chloride, polyacetal, polyamide, polycarbonate, modified polyphenylene ether, polybutylene terephthalate, polyethylene terephthalate, polysulfone, polyethersulphone, polyphenylene sulfide, polyamide imide, polymethylpentene, liquid crystal polymer, epoxy resin, phenol resin, urea resin, melamine resin, epoxy resin, diallyl phthalate resin, unsaturated polyester resin, polyimide, polyurethane, silicone resin, or a mixture of some of these substances.

The resin molded product according to the present embodiment may include quantum dots fluorescent pigments other than quantum dots and fluorescent substances as fluorescent dye. Examples of such materials include, a red light emission quantum dot that emits red light when irradiated with blue light and a green light emission fluorescent substance that emits green light or a red light emission quantum dot that emits green light and a red light emission fluorescent substance that emits red light. White light can be obtained by irradiating such a resin molded product with blue light. Examples of the fluorescent substance include YAG (yttrium aluminum garnet) base, TAG (terbium aluminum garnet) base, sialon base, BOS (barium orthosilicate) base, but the material is not particularly limited.

A dispersion state of quantum dots of the present embodiment refers to a dispersion state in which quantum dots are singly dispersed in resin, a dispersion state in which a plurality of quantum dots form an aggregate and such aggregates are dispersed in resin or single quantum dots and an aggregate of quantum dots are dispersed respectively in resin.

Not more than several hundreds of aggregates are contained in resin within a square of 500 nm. To be more specific, on the order of 3 to 300 aggregates are preferably contained. Regarding the scale of each aggregate, the length in the longitudinal direction is 100 nm or less and preferably 70 nm or less. Furthermore, the aggregate is preferably composed of not more than several hundreds of aggregated quantum dots. To be more specific, the aggregate is preferably composed of on the order of 1 to 300 quantum dots. In this way, according to the present embodiment, quantum dots form each aggregate and these aggregates are appropriately dispersed in resin.

The following applications can be provided using the resin molded product according to the present embodiment. FIG. 1 to FIG. 9 illustrate application examples using the resin molded product according to the present embodiment.

In FIG. 1, a wavelength conversion bar (fluorescence bar) 3 is interposed between light-emitting devices 1 such as LEDs and a light-guiding board 2. The wavelength conversion bar 3 shown in FIG. 1 is configured by molding quantum-dot-containing resin of the present embodiment into a bar shape, rod shape or stick shape. Light emitted from the light-emitting device 1 is wavelength-converted by the wavelength conversion bar 3, and the wavelength-converted light is emitted to the light-guiding board 2. For example, the wavelength conversion bar 3 includes quantum dots having a fluorescence wavelength of 520 nm (green color) and 660 nm (red color). For example, part of blue photons emitted from the light-emitting device 1 is converted to green color or red color by the quantum dots and white light is thereby emitted from the wavelength conversion bar 3 toward the light-guiding board 2.

Figure 2:
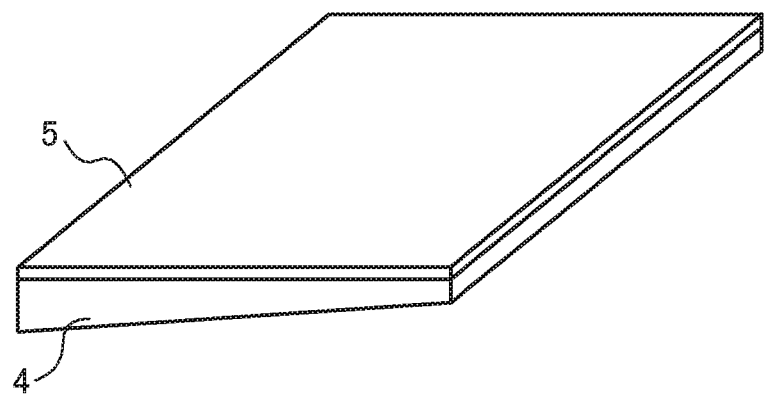
FIG. 2 is a perspective view illustrating an application example using the resin molded product of the present embodiment.

FIG. 2 shows a wavelength conversion sheet 5 which is formed using the quantum-dot-containing resin of the present embodiment provided on a light emission surface of the light-guiding board 4. According to the present embodiment, the wavelength conversion sheet 5 is formed into a sheet-like shape in advance, instead of applying and forming it on the light-guiding board 4. The wavelength conversion sheet 5 is superimposed on the light emission surface of the light-guiding board 4. Another film such as a diffusion film may be interposed between the light-guiding board 4 and the wavelength conversion sheet 5.

The light-guiding board 4 itself may be molded using the quantum-dot-containing resin of the present embodiment. In this case, it does not matter whether or not the wavelength conversion sheet 5 is present. Both the light-guiding board 4 and the wavelength conversion sheet 5 may also include quantum dots that emit green light and quantum dots that emit red light. Furthermore, the light-guiding board 4 may also include quantum dots that emit green light and the wavelength conversion sheet may include quantum dots that emit red light. Conversely, the light-guiding board 4 may include quantum dots that emit red light and the wavelength conversion sheet 5 may include quantum dots that emit green light.

Note that the fluorescence member using the resin molded product of the present embodiment can conduct wavelength conversion, and therefore, it can be said to be a wavelength conversion member, and both are not clearly distinguishable.

Figure 3:
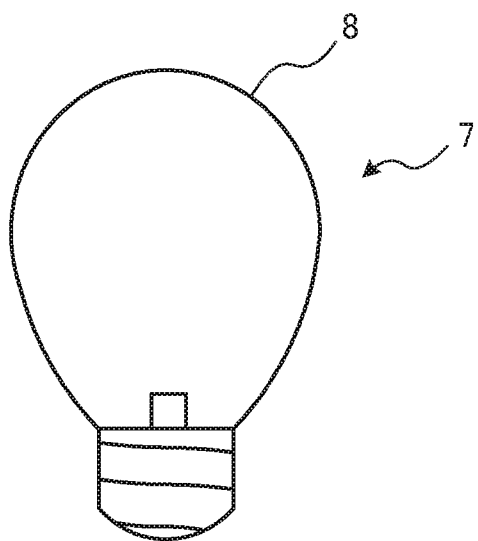
FIG. 3 is a front view illustrating an application example using the resin molded product of the present embodiment.

In FIG. 3, for example, an illumination cover 8 of an illumination device 7 can be molded using the quantum-dot-containing resin of the present embodiment. Here, "illumination" refers to a state in which lighting is provided indoors or outdoors. In the present embodiment, the resin molded product can be molded into, for example, an electric bulb shape as shown in FIG. 3 or a surface emitting type illumination cover shape. It is possible to obtain a white illumination device 7 using a blue light-emitting LED as a light-emitting device of the illumination device 7, and using an illumination cover 8 including both quantum dots that convert blue light to red light and quantum dots that convert blue light to green light. Illumination of desired color can be obtained by adjusting the amount of quantum dots and ratio.

As a mode of the illumination device, the structure shown in FIG. 2 may be used to perform surface emission. In this case, the plane shape of the light-guiding board 4 and the wavelength conversion sheet 5 when seen from above may be rectangular or square, but without being limited to this, any free shape such as circular, triangular, hexagonal can be adopted. A curved surface as shown in FIG. 3 or a flat surface may be used and the surface shape is not limited. The illumination device may also be a fiber shape.

Furthermore, a structure may also be adopted in which the space between the light-emitting device of the illumination device and the illumination surface (light emission surface) is filled with quantum-dot-containing resin. That is, it is possible to create an illumination of a free shape.

Figure 4:
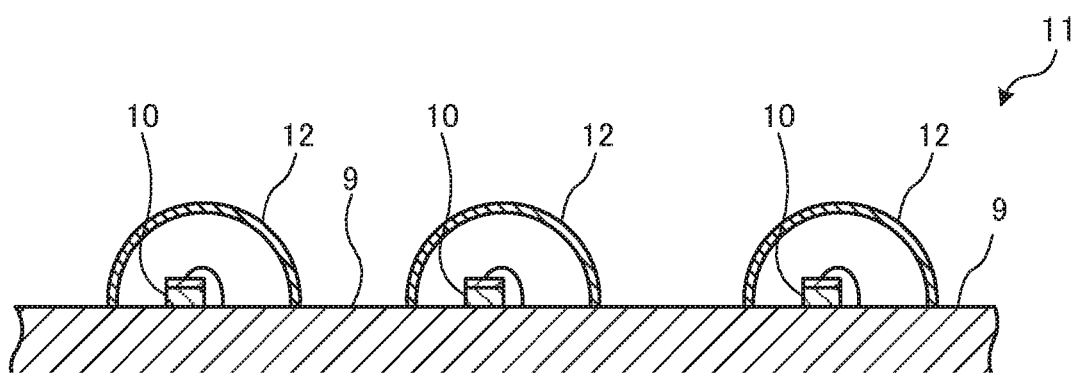
FIG. 4 is a partial cross-sectional view illustrating an application example using the resin molded product of the present embodiment.

FIG. 4 illustrates a light source unit 11 with a plurality of light-emitting devices 10 such as LEDs installed on a base material 9. A dome-shaped lens part 12 covers each light-emitting device 10 as shown in FIG. 4. The dome-shaped lens part 12 has, for example, a semispherical shape, an inside of which is hollow. The space between the base material 9, the light-emitting device 10, and the surface inside the lens part 12 may be hollow or may be filled with an appropriate resin material. The lens part 12 may be molded using the quantum-dot-containing resin according to the present embodiment. For example, by applying a transparent adhesive or the like to a part where the lens part 12 is in contact with the base material 9 to a predetermined thickness, it is possible to simply paste the lens part 12 to the top surface of the base material 9 by covering each light-emitting device 10. A white light source unit 11 is obtained using a blue light-emitting LED as the light-emitting device 10 and using the lens part 12 including quantum dots that convert blue light to red light and quantum dots that convert blue light to green light.

Figure 5:
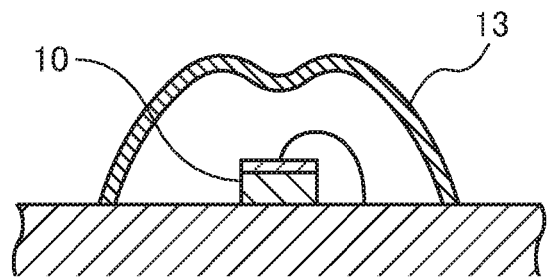
FIG. 5 is a partial cross-sectional view illustrating an application example using the resin molded product of the present embodiment.
Figure 6:
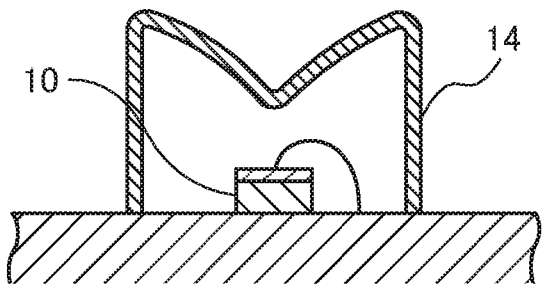
FIG. 6 is a partial cross-sectional view illustrating an application example using the resin molded product of the present embodiment.

FIG. 5 and FIG. 6 are different from FIG. 4 in the shapes of lens parts 13 and 14. The lens part 13 shown in FIG. 5 has a shape in which the top surface central part of the dome-shaped lens part shown in FIG. 4 is dented downward, whereas the lens part 14 shown in FIG. 6 has a cylindrical side face and has a shape, a top central part having a rectangular cross section is dented downward. It is thereby possible to change a radiation angle range of light and radiation direction from those of the light source unit 11 shown in FIG. 4.

In FIG. 4 to FIG. 6, the structure may be such that the interior of each lens is filled with the quantum-dot-containing resin according to the present embodiment. Alternatively, a part of quantum-dot-containing resin in which the light-emitting device 10 is disposed may be dented and a surface of which is molded into the lens surface shown in FIG. 4 to FIG. 6. For example, the lens parts 12, 13 or 14 may be formed directly by injection molding on the base material 9 on which the light-emitting device 10 is mounted.

Figure 7:
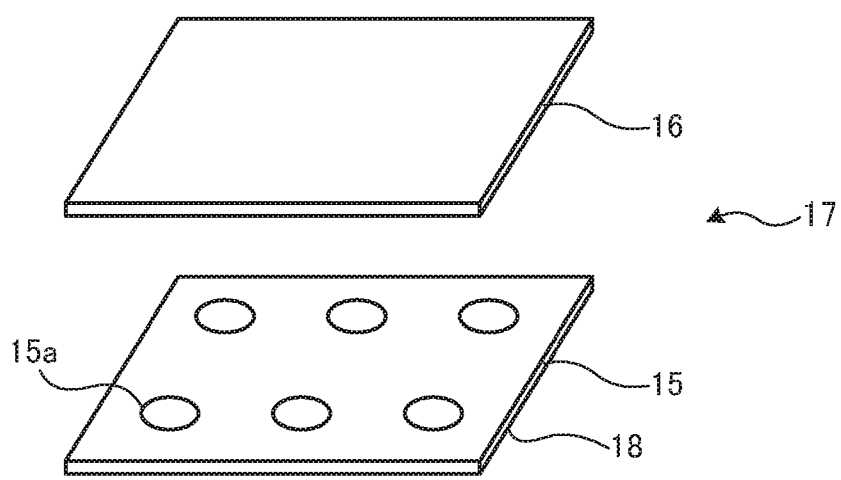
FIG. 7 is a perspective view illustrating an application example using the resin molded product of the present embodiment.

FIG. 7 illustrates a light diffusion apparatus 17 provided with a light emission sheet 15 and a diffusion board 16. The light emission sheet 15 is provided with a plurality of light sources 15a and each light source 15a is composed of a light-emitting device such as an LED and a resin layer that covers the surface side of each light-emitting device. The light emission sheet 15 shown in FIG. 7 has a structure in which each light source 15a is molded on a support body 18. The resin layer that covers each light-emitting device of each light source 15a can be formed of quantum-dot-containing resin. For example, the light emission sheet 15 is the light source unit 11 shown in FIG. 4.

The light diffusion apparatus 17 shown in FIG. 7 constitutes a backlight or the like disposed on the rear side corresponding to a display section such as a liquid crystal display. Furthermore, the light diffusion apparatus 17 shown in FIG. 7 can also be used as an illumination.

In FIG. 7, the diffusion board 16 may be formed of a molded product of quantum-dot-containing resin. In this case, quantum dots may or may not be contained in the resin layer that covers a light-emitting device such as an LED in each light source 15a provided on the light emission sheet 15. Both the resin layer of each light source 15a and the diffusion board 16 may also include quantum dots that emit green light and quantum dots that emit red light. Furthermore, the resin layer of each light source 15a may include quantum dots that emit green light and the diffusion board 16 may include quantum dots that emit red light. Conversely, the resin layer of each light source 15a may include quantum dots that emit red light and the diffusion board 16 may include quantum dots that emit green light.

Figure 8:
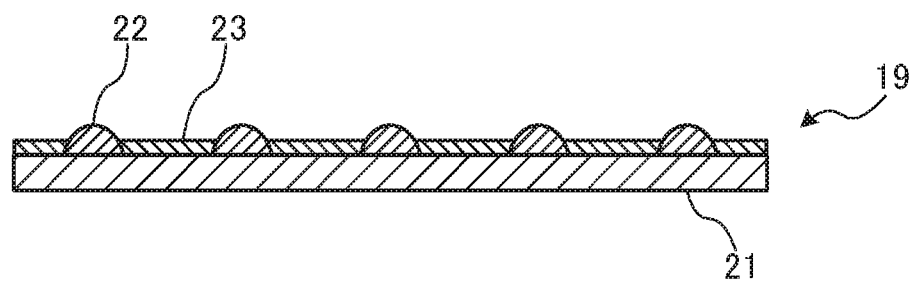
FIG. 8 is a cross-sectional view illustrating an application example using the resin molded product of the present embodiment.
Figure 9:
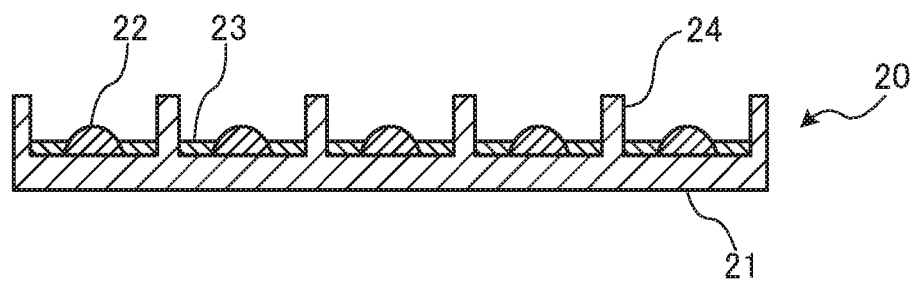
FIG. 9 is a cross-sectional view illustrating an application example using the resin molded product of the present embodiment.

FIG. 8 and FIG. 9 illustrate light source apparatuses 19 and 20. As shown in FIG. 8, the light source apparatus 19 is composed of an array of light sources 22 each provided with a plurality of LEDs on a base material 21, and reflectors 23 disposed between the respective light sources 22. Each light source 22 may include a light-emitting device such as an LED. The reflector 23 is formed of the quantum-dot-containing resin according to the present embodiment. For example, the quantum-dot-containing resin of the present embodiment can be molded and processed into the reflector 23.

The light source apparatus 19 in FIG. 8 is, for example, a backlight, and a display section such as a diffusion board and a liquid crystal display (not shown) is provided above the light source apparatus 19.

The light source apparatus 19 has a structure in which the reflector 23 is arranged around each light source 22, light returning to the light source apparatus 19 side is reflected by the reflector 23, allowing the entire surface of the light source apparatus 19 to emit uniform light toward the display section.

In the light source apparatus 20 shown in FIG. 9, a side wall 24 is provided between neighboring light sources 22. The side walls 24 are formed into, for example, a grid shape and the light source 22 and the reflector 23 are arranged in each grid-shaped space. Providing the side wall 24 for partitioning each light source 22 can improve reflection efficiency and optical wavelength conversion efficiency. As shown in FIG. 9, the side wall 24 may be molded integrally with the base material 21 or may be molded separately. Alternatively, the reflector 23 and the side wall 24 may be integrated into one unit. For example, quantum-dot-containing resin of the present embodiment can be molded and processed into the reflector 23 and the side wall 24.

Figure 10A:
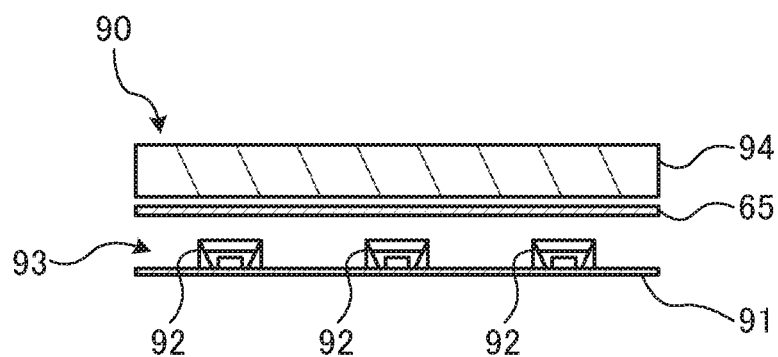
FIGS. 10A and 10B are schematic views of an application using a sheet member provided with quantum dots of the present embodiment.

FIG. 10 is a schematic view of an application using a sheet member provided with quantum dots of the present embodiment. A sheet member 65 including quantum dots can be assembled into, for example, a backlight apparatus 93 shown in FIG. 10A. In FIG. 10A, the backlight apparatus 93 is composed of a plurality of light-emitting devices 92 (LEDs) and the sheet member 65 disposed opposite to light-emitting devices 92. As shown in FIG. 10A, each light-emitting device 92 is supported by a surface of a support body 91. In FIG. 10A, the backlight apparatus 93 is arranged on the back side of a display section 94 such as a liquid crystal display to constitute a display apparatus 90. Note that the light-emitting device 92 shown in FIG. 10A may be the light source unit 11 shown in FIG. 4.

Note that although not shown in FIG. 10A, a diffusion board for diffusing light and another sheet or the like may be interposed between the light-emitting device 92 and the display section 94 in addition to the sheet member 65.

Although the sheet member 65 is formed as a single sheet, a plurality of sheet members 65 may be connected together so as to have a predetermined size. The configuration in which the plurality of sheet members 65 connected together through tiling will be referred to as a "composite sheet member" hereinafter.

Figure 10B:
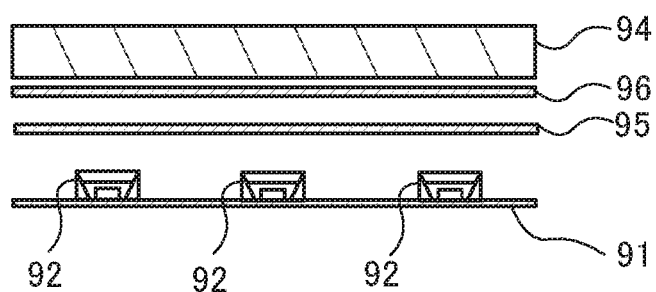

In FIG. 10B, the light-emitting device 92, a composite sheet member 95, a diffusion board 96 and the display section 94 are arranged in that order. Even when unevenness of a light emission color occurs due to deterioration of quantum dots caused by irregular reflection or vapor permeating from a joint between sheet members constituting the composite sheet member 95, it is possible to appropriately suppress the occurrence of unevenness in color on a display of the display section 94. That is, since the light emitted from the composite sheet member 95 is diffused by the diffusion board 96 and then enters the display section 94, it is possible to suppress unevenness in color on the display of the display section 94.

Figure 11A:
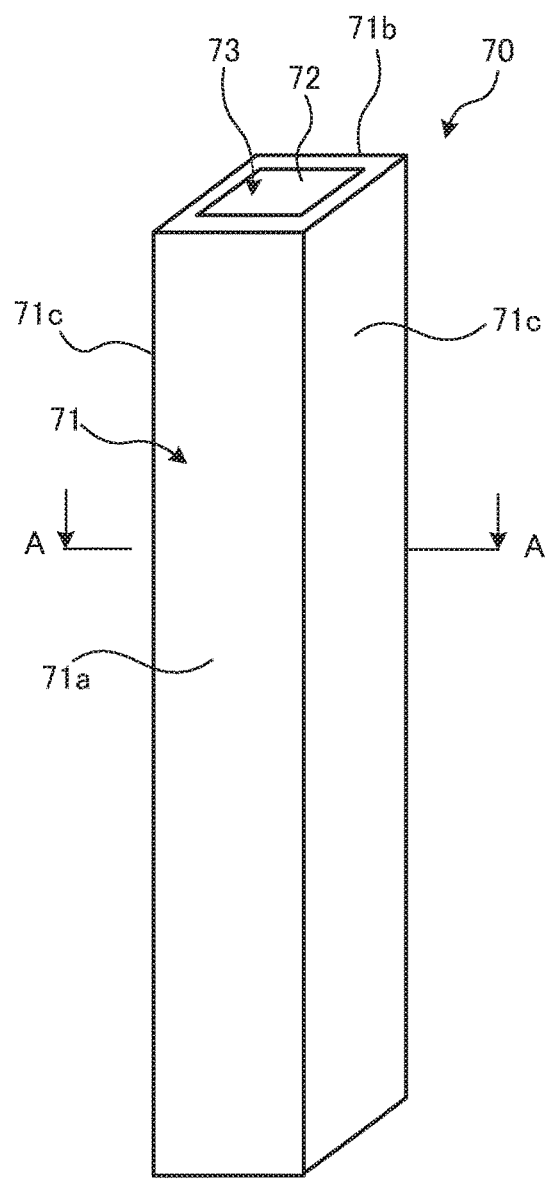
FIGS. 11A and 11B are a perspective view and a cross-sectional view along a line A-A indicated by arrows of the wavelength conversion apparatus provided with quantum dots according to the present embodiment.
Figure 11B:
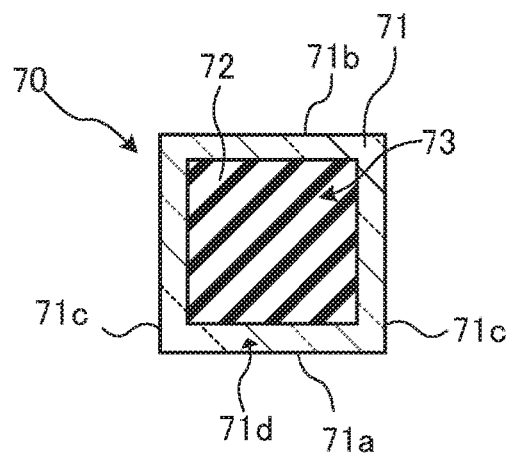

FIG. 11 is a perspective view and a cross-sectional view along a line A-A of the wavelength conversion apparatus provided with quantum dots according to the present embodiment. FIG. 11A is a perspective view of the wavelength conversion apparatus and FIG. 11B is a cross-sectional view of the wavelength conversion apparatus shown in FIG. 11A cut in a surface direction along the line A-A and seen from a direction indicated by arrows.

As shown in FIG. 11A, a wavelength conversion apparatus 70 is composed of a container 71 and a molded body 72 containing a wavelength conversion substance.

The container 71 is provided with a storage space 73 that can accommodate and store the molded body 72 including a wavelength conversion substance. The container 71 is preferably a transparent member. The term "transparent" refers to what is generally recognized as being transparent or what has a visible light transmittance of approximately 50% or more.

The longitudinal and lateral sizes of the container 71 are on the order of several mm to several tens of mm, and the longitudinal and lateral sizes of the storage space 73 are on the order of several hundreds of μm to several mm.

As shown in FIG. 11, the container 71 is provided with a light incident surface 71a, a light emission surface 71b and a side face 71c that connects the light incident surface 71a and the light emission surface 71b. As shown in FIG. 11, the light incident surface 71a and the light emission surface 71b are located opposite to each other.

As shown in FIG. 11, the storage space 73 is formed in the container 71 inside the light incident surface 71a, the light emission surface 71b and the side face 71c. Note that part of the storage space 73 may reach the light incident surface 71a, the light emission surface 71b or the side face 71c.

The container 71 shown in FIG. 11 is, for example, a glass tube container such as a glass capillary. However, the container 71 may be made of resin or the like if it can constitute the above-described container with excellent transparency.

As shown in FIG. 11, the molded body 72 containing the wavelength conversion substance is disposed in the storage space 73. As shown in FIG. 11, the storage space 73 has an opening from which the molded body 72 containing the wavelength conversion substance can be inserted.

The molded body 72 containing the wavelength conversion substance can be inserted into the storage space 73 by means such as pressure fitting or adhesion. When the molded body 72 is press-fitted, by molding the molded body 72 containing the wavelength conversion substance in completely the same size as the storage space 73 or in a size slightly greater than the storage space and inserting the molded body 72 containing the wavelength conversion substance into the storage space 73 while adding a pressure, it is possible to prevent a gap from being produced not only in the molded body 72 containing the wavelength conversion substance but also between the molded body 72 containing the wavelength conversion substance and the container 71.

Furthermore, when the molded body 72 containing the wavelength conversion substance is adhered and fixed to the storage space 73, the molded body 72 containing the wavelength conversion substance is molded so as to be smaller than the storage space 73, and with an adhesion layer applied to the side face of the molded body 72 containing the wavelength conversion substance, the molded body 72 containing the wavelength conversion substance is inserted into the storage space 73. In this case, the cross-sectional area of the molded body 72 may be slightly smaller than the cross-sectional area of the storage space 73. In this way, the molded body 72 containing the wavelength conversion substance and the container 71 come into close contact with each other via the adhesion layer, making it possible to prevent a gap from being formed between the molded body 72 containing the wavelength conversion substance and the container 71. For the adhesion layer, the same resin as the molded body 72 or resin having a common basic structure can be used. Alternatively, a transparent adhesive member may also be used as the adhesion layer.

Furthermore, a refractive index of the molded body 72 containing the wavelength conversion substance may be preferably smaller than a refractive index of the container 71. Thus, part of light incident on the molded body 72 containing the wavelength conversion substance is totally reflected by the side wall portion of the container 71 facing the storage space 73. This is because an angle of incidence on the medium side which has a smaller refractive index is greater than an angle of incidence on the medium side which has a greater refractive index. This makes it possible to reduce the amount of light leaking from the side of the container 71 toward the outside, thus improving color conversion efficiency and light emission intensity.

A light-emitting device is disposed on the light incident surface 71a side of the wavelength conversion apparatus 70 shown in FIG. 11. Furthermore, the light-guiding board 2 or the like shown in FIG. 1 is disposed on the light emission surface 71b side of the wavelength conversion apparatus 70.

Note that in FIG. 11, the molded body 72 is used, but a resin composition containing quantum dots may be injected to form a quantum dot layer.

Figure 12:
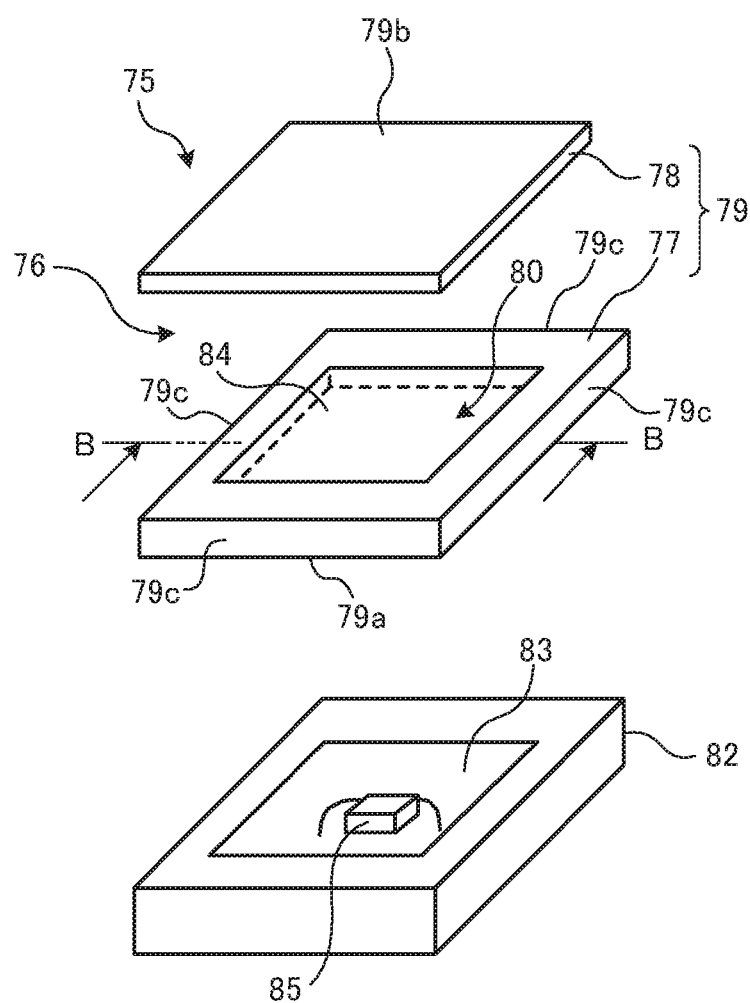
FIG. 12 is a perspective view of a light-emitting apparatus composed of a wavelength conversion member provided with quantum dots in the present embodiment.
Figure 13:
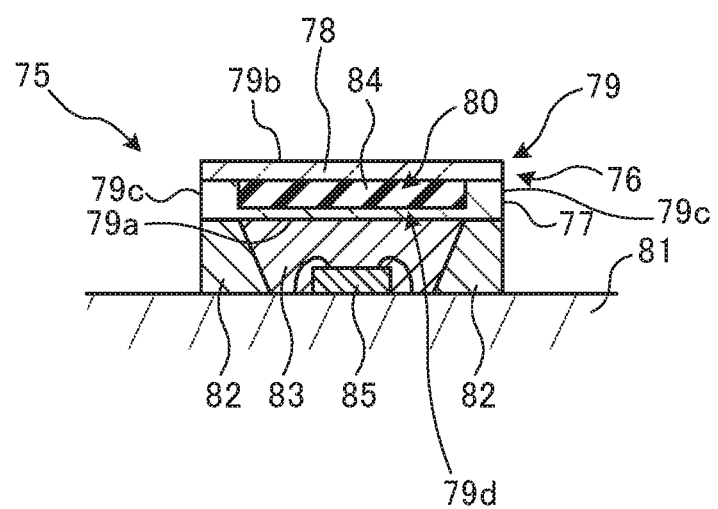
FIG. 13 is a cross-sectional view of the light-emitting device shown in FIG. 12 with the respective members thereof assembled together, cut along a line B-B in a height direction and viewed from the arrow direction.

FIG. 12 is a perspective view of the light-emitting apparatus composed of the wavelength conversion member provided with the quantum dots according to the present embodiment. FIG. 13 is a cross-sectional view of the light-emitting device shown in FIG. 12 in which the respective members are assembled, cut along a line B-B in a height direction and seen from a direction indicated by arrows.

The light-emitting device 75 shown in FIG. 12 and FIG. 13 is composed of a wavelength conversion member 76 and an LED chip (light emission section) 85. The wavelength conversion member 76 is provided with a container 79 composed of a plurality of pieces such as a container body 77 and a lid 78. Furthermore, as shown in FIG. 12, a bottomed storage space 80 is formed in the center of the container body 77. A wavelength conversion layer 84 containing quantum dots is provided in the storage space 80. The wavelength conversion layer 84 may be a molded body or may fill the inside of the storage space 80 through potting processing or the like. The container body 77 and the lid 78 are joined together via an adhesion layer.

An undersurface of the container 79 of the wavelength conversion member 76 shown in FIG. 12 and FIG. 13 is alight incident surface 79a. A top surface facing the light incident surface 79a is a light emission surface 79b. The storage space 80 is formed at a position inside each side face 79c provided in the container 79 of the wavelength conversion member 76 shown in FIG. 12 and FIG. 13.

As shown in FIG. 13, the LED chip 85 is connected to a print wiring substrate 81 and the LED chip 85 is surrounded by a frame body 82 as shown in FIG. 12 and FIG. 13. The inside of the frame body 82 is sealed with a resin layer 83.

As shown in FIG. 13, the wavelength conversion member 76 is joined to the top surface of the frame body 82 via an adhesion layer (not shown) to constitute a light-emitting device 75 such as an LED.

It is thereby possible to freely mold the quantum-dot-containing resin according to the present embodiment into various shapes and manufacture a resin molded product of a predetermined shape at low cost. In this case, the quantum-dot-containing resin includes metal soap (preferably calcium stearate), it is possible to increase dispersibility of particles of quantum dots and improve durability with respect to environmental changes. Note that an example using quantum dots that emit green light and quantum dots that emit red light when blue light is radiated has been described as an application using the resin molded product according to the present embodiment, but the application is not limited to this. That is, as the resin molded product in the present embodiment, a resin molded product containing quantum dots and fluorescent substances other than the quantum dots can also be used for the applications in FIG. 1 to FIG. 13. For example, when blue light is radiated, a red light emission fluorescent substance that emits red light can be used instead of red light emission quantum dots that emit red light. Alternatively, a green light emission fluorescent substance that emits green light can be used instead of green light emission quantum dots that emit green light. Furthermore, the application using the resin molded product according to the present embodiment is not limited to the wavelength conversion member that converts the wavelength of light emitted from a light-emitting device such as an LED. For example, the resin molded product of the present embodiment may be used for a light-emitting apparatus that converts electric energy to light through quantum dots. Alternatively, the resin molded product of the present embodiment may be used for a photoelectric conversion apparatus that converts light to electric energy through quantum dots.

Figure 14:
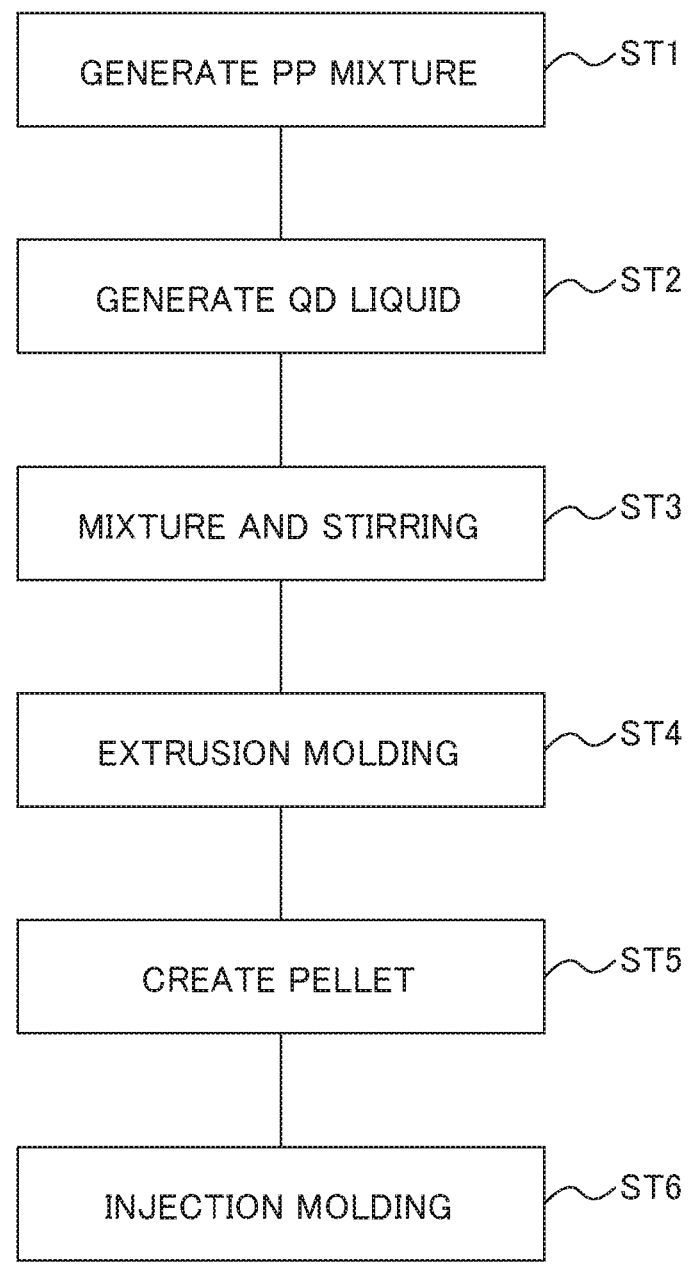
FIG. 14 is a flowchart illustrating a method for manufacturing the resin molded product according to the present embodiment.

The method for manufacturing a resin molded product according to the present embodiment has a feature of molding a resin composition obtained by dispersing quantum dots in resin. A specific manufacturing method thereof will be described using FIG. 14. FIG. 14 is a flowchart illustrating the method for manufacturing a resin molded product according to the present embodiment.

In step ST1 in FIG. 14, a PP mixture is generated by stirring, for example, polypropylene (PP) as resin, elastomer and metal soap. As the metal soap, use of calcium stearate is suitable. It is possible to arbitrarily determine whether or not to contain elastomer. Metal soap may be suitably contained to improve dispersibility of quantum dots as shown in an experiment which will be described later.

Next, in step ST2 in FIG. 14, quantum dots (QD) are dispersed in a solvent and a QD liquid is generated. Here, organosilane or hexane is suitably used as the solvent.

Next, in step ST3 in FIG. 14, the PP mixture generated in ST1 is mixed with the QD liquid generated in ST2 and the mixture is stirred until it becomes uniform.

Next, in step ST4 in FIG. 14, the mixture obtained in ST3 is introduced into an extruder, the mixture is extruded and kneaded at a predetermined temperature and the wire obtained is introduced into a cutter and a pellet is created (ST5).

In step ST6 in FIG. 14, the pellet is introduced into an injection molding machine which is set to a predetermined cylinder temperature, injected into a metal die and a resin molded product is created.

According to the method for manufacturing a resin molded product of the present embodiment described above, it is possible to freely create molded products of various shapes using quantum-dot-containing resin.

The present embodiment mixes the metal soap when generating the PP mixture in ST1 in order to increase dispersibility of quantum dots. The metal soap wraps the quantum dots in the resin. The metal soap is distributed around the quantum dots and the dispersibility of the quantum dots in the resin thereby further improves. For example, instead of mixing the metal soap during injection molding in ST6, the PP mixture into which the metal soap is introduced is extruded and kneaded. Thus, dispersibility of quantum dots with respect to resin in the resin molded product effectively increases.

The order of steps ST1 and ST2 shown in FIG. 14 is not particularly determined as long as ST1 and ST2 come before ST3. Note that ST3 to ST6 are executed in the order in FIG. 14.

Furthermore, for example, instead of generating the PP mixture beforehand as shown in ST1, after generating the QD solution in ST2, polypropylene, elastomer and metal soap may be mixed into the QD solution. In this case, the order in which polypropylene, elastomer and metal soap are mixed is not determined.

Furthermore, according to the present embodiment, a scattering agent may be mixed into the QD solution. Minute particles of silica ($SiO_2$), BN, AlN or the like can be presented as the scattering agent.

EXAMPLES

Hereinafter, examples and comparative examples implemented to clarify the effects of the present invention will be described in detail. Note that the present invention will not be limited by the following examples at all. For example, although examples will be described in the following examples where a resin molded product is molded by injection molding, the resin molded product of the present invention may also be created using methods such as extrusion molding, hollow molding, thermoforming, compression molding, calendar molding, inflation method or casting method.

Materials

The following materials were used to create the following resin molded product.
Resin: polypropylene
Elastomer: Hybrar (registered trademark) 7311 manufactured by KURARAY CO., LTD
Organosilane: cyclohexyl (dimethoxy) methyl silane
Quantum dot (QD): red light emission quantum dots and green light emission quantum dots having core/shell structure
Dispersant: calcium stearate Extruder Small two-axis extruder
Name of manufacturer: Kawabe Manufacturing Co., Ltd.
Specification screw diameter: 16 mm
L/D: 40
Maximum kneading temperature: 400° C.

Sample 1-1

(1) 1.6 kg of polypropylene (referred to as "PP"), 0.4 kg of elastomer and approximately 1 g of calcium stearate (referred to as "StCa") were entered in a vinyl chuck bag (34×50 cm) and well stirred to form a PP mixture.
(2) Next, 4 g of quantum dots (referred to as "QD") was dispersed into 40 ml of purified and distilled organosilane, added to the PP mixture and well stirred until it became uniform.
(3) The mixture obtained in (2) was introduced into a hopper of the extruder, a PP wire was extruded and kneaded at an extrusion temperature of 200° C. to 250° C. (adjusted as appropriate). The PP wire was directly introduced from an outlet nozzle to a water tank and cooled to acquire a wire having a diameter of 1 to 2 mm. This wire was further introduced into a cutter and a pellet having a length of approximately 4 mm was created. The QD concentration of sample 1-1 was 2000 ppm.

Sample 1-2

0.8 g of QD was dispersed into 40 ml of organosilane, 2.5 ml thereof was added to 500 g of the PP mixture and the rest of operation conducted was similar to that of sample 1-1. The QD concentration in sample 1-2 was 1000 ppm.

Sample 1-3

The same operation as that in sample 1-1 was conducted except using the QD liquid used in sample 1-2 having a QD concentration of 1000 ppm diluted ten times with organosilane. The QD concentration in sample 1-3 was 100 ppm.

Sample 2-1

The mixing condition and the extrusion condition were changed using the same raw materials as those of sample 1-1. To be more specific, PP and elastomer were mixed with the QD liquid. The extrusion temperature was raised to sufficiently evaporate organosilane more than in sample 1 and the extrusion speed was decreased. The QD concentration in sample 2-1 was 2000 ppm.

Sample 2-2

Sample 2-2 was created using a method similar to that of sample 2-1 but calcium stearate was not used. The QD concentration in sample 2-2 was 2000 ppm.

Sample 3

Sample 3 was created using a method similar to that of sample 2-1. However, hexane was used as a solvent to disperse QD. Use of hexane helps QD disperse well, and even when PP was mixed with elastomer, there was less stickness. The QD concentration in sample 3 was 2000 ppm.

Sample 4-1

Sample 4-1 was created using a method similar to that in sample 3. However, the QD concentration was set to 200 ppm.

Sample 4-2

Sample 4-2 was created using a method similar to that in sample 4-1. However, 5 weight % of silica minute particles ($SiO_2$ minute particles having a particle diameter of 1.0 μm) was added as a scattering agent. The QD concentration in sample 4-2 was 200 ppm.

Sample 4-3

Sample 4-3 was created using a method similar to that in sample 4-1. However, 10 weight % of silica minute particles was added as the scattering agent. The QD concentration in sample 4-3 was 200 ppm.

[Durability Test on PP Extrusion Molded Product with Dispersed QD]

A wire-like sample having a length of 5 cm was sandwiched by a sample holder provided with three blue (wavelength: 450 nm) LEDs, the LEDs were turned on under the following conditions and a time variation in light emission intensity from each sample was traced.

Durability Test Conditions (1) 60° C. 90RH, LED turned ON at 60 mA
(2) 60° C. 90RH, LED turned ON at 30 mA
(3) 60° C. 90RH, LED not turned ON
(4) In room, LED turned ON at 60 mA
(5) Under 60° C. atmosphere, LED turned ON at 60 mA Note that a thermo-hygrostat IW222 manufactured by YAMATO Scientific Co., Ltd. was used for a durability test under 60° C. 90RH. Regarding light emission intensity, each sample was sandwiched by a sample holder provided with three blue (wavelength: 450 nm) LEDs and when the LEDs were caused to emit light with LED excitation light of 450 nm (20 mW×3), a total luminous flux was measured using a total luminous flux measuring system manufactured by OTSUKA ELECTRONICS Co., Ltd.

Table 1 below shows experiment results of samples 1-1 and 1-2.

TABLE 1

| SAMPLE NAME | COMMENT | TIME (h) | RED PEAK WAVELENGTH (nm) | RED PEAK INTENSITY | RED PEAK AREA | GRAPH CLASSIFICATION | REMARKS | GREEN PEAK WAVELENGTH (nm) | GREEN PEAK INTENSITY | GREEN PEAK AREA |
|---|---|---|---|---|---|---|---|---|---|---|
| RT 60 mA | 1000 ppm | 0 | | | | 1000 ppm | 60 mA ON | 533 | 0.0000250 | 0.001170 |
| 60 ATMOSPHERE 60 mA | 1000 ppm | 0 | | | | 1000 ppm | 60 mA ON | 533 | 0.0000228 | 0.001082 |
| 60-90 60 mA | 1000 ppm | 0 | | | | 1000 ppm | 60 mA ON | 532 | 0.0000220 | 0.001042 |
| 60-90 30 mA | 1000 ppm | 0 | | | | 1000 ppm | 30 mA ON | 532 | 0.0000200 | 0.000937 |
| 60-90 NOT ON | 1000 ppm | 0 | | | | 1000 ppm | NOT ON | 534 | 0.0000194 | 0.000926 |
| RT 60 mA | 2000 ppm | 0 | | | | 2000 ppm | 60 mA ON | 534 | 0.0000150 | 0.000725 |
| 60 ATMOSPHERE 60 mA | 2000 ppm | 0 | | | | 2000 ppm | 60 mA ON | 534 | 0.0000167 | 0.000795 |
| 60-90 60 mA | 2000 ppm | 0 | | | | 2000 ppm | 60 mA ON | 534 | 0.0000160 | 0.000752 |
| 60-90 30 mA | 2000 ppm | 0 | | | | 2000 ppm | 30 mA ON | 534 | 0.0000162 | 0.000789 |
| 60-90 NOT ON | 2000 ppm | 0 | | | | 2000 ppm | NOT ON | 534 | 0.0000194 | 0.000917 |
| RT 60 mA | 1000 ppm | 43 | | | | 1000 ppm | 60 mA ON | 534 | 0.0000406 | 0.001853 |
| 60 ATMOSPHERE 60 mA | 1000 ppm | 41 | | | | 1000 ppm | 60 mA ON | 535 | 0.0000388 | 0.001783 |
| 60-90 60 mA | 1000 ppm | 43 | | | | 1000 ppm | 60 mA ON | 490 | 0.0000116 | 0 |
| 60-90 30 mA | 1000 ppm | 41 | | | | 1000 ppm | 30 mA ON | 490 | 0.0000089 | 0 |
| 60-90 NOT ON | 1000 ppm | 41 | | | | 1000 ppm | NOT ON | 532 | 0.0000203 | 0.000975 |
| RT 60 mA | 2000 ppm | 43 | | | | 2000 ppm | 60 mA ON | 536 | 0.0000278 | 0.001294 |
| 60 ATMOSPHERE 60 mA | 2000 ppm | 41 | | | | 2000 ppm | 60 mA ON | 534 | 0.0000283 | 0.001270 |
| 60-90 60 mA | 2000 ppm | 41 | | | | 2000 ppm | 60 mA ON | 490 | 0.0000054 | 0 |
| 60-90 30 mA | 2000 ppm | 41 | | | | 2000 ppm | 30 mA ON | 490 | 0.0000079 | 0 |
| 60-90 NOT ON | 2000 ppm | 41 | | | | 2000 ppm | NOT ON | 533 | 0.0000229 | 0.001092 |
| RT 60 mA | 1000 ppm | 92 | | | | 1000 ppm | 60 mA ON | 535 | 0.0000400 | 0.001829 |
| 60 ATMOSPHERE 60 mA | 1000 ppm | 92 | | | | 1000 ppm | 60 mA ON | 534 | 0.0000371 | 0.001681 |
| 60-90 60 mA | 1000 ppm | 92 | | | | 1000 ppm | 60 mA ON | 534 | 0.0000197 | 0.000959 |
| 60-90 NOT ON | 1000 ppm | 92 | | | | 1000 ppm | NOT ON | 536 | 0.0000252 | 0.001164 |
| RT 60 mA | 2000 ppm | 92 | | | | 2000 ppm | 60 mA ON | 533 | 0.0000233 | 0.001042 |
| 60 ATMOSPHERE 60 mA | 2000 ppm | 92 | | | | 2000 ppm | 60 mA ON | 535 | 0.0000212 | 0.001015 |
| 60-90 60 mA | 2000 ppm | 92 | | | | 2000 ppm | 60 mA ON | 533 | 0.0000396 | 0.001795 |
| 60-90 NOT ON | 2000 ppm | 92 | | | | 2000 ppm | NOT ON | 532 | 0.0000354 | 0.001587 |
| RT 60 mA | 1000 ppm | 160 | | | | 1000 ppm | 60 mA ON | 534 | 0.0000200 | 0.000975 |
| 60 ATMOSPHERE 60 mA | 1000 ppm | 160 | | | | 1000 ppm | 60 mA ON | 534 | 0.0000237 | 0.001091 |
| 60-90 60 mA | 1000 ppm | 160 | | | | 1000 ppm | 60 mA ON | 532 | 0.0000175 | 0.000783 |
| 60-90 NOT ON | 1000 ppm | 160 | | | | 1000 ppm | NOT ON | 534 | 0.0000207 | 0.000998 |
| RT 60 mA | 2000 ppm | 160 | | | | 2000 ppm | 60 mA ON | 532 | 0.0000374 | 0.001695 |
| 60 ATMOSPHERE 60 mA | 2000 ppm | 160 | | | | 2000 ppm | 60 mA ON | 532 | 0.0000313 | 0.001394 |
| 60-90 60 mA | 1000 ppm | 235 | | | | 1000 ppm | 60 mA ON | 535 | 0.0000191 | 0.000939 |
| 60-90 NOT ON | 1000 ppm | 235 | | | | 1000 ppm | NOT ON | 534 | 0.0000189 | 0.000874 |
| 50 ATMOSPHERE 60 mA | 2000 ppm | 235 | | | | 2000 ppm | 60 mA ON | 532 | 0.0000123 | 0.000553 |
| 60-90 NOT ON | 2000 ppm | 235 | | | | 2000 ppm | NOT ON | 535 | 0.0000195 | 0.000936 |

| SAMPLE NAME | GREEN HALF-VALUE WIDTH (nm) | RED HALF-VALUE WIDTH (nm) | EXCITATION LIGHT WAVELENGTH (nm) | EXCITATION LIGHT AREA | LIGHT EMISSION EFFICIENCY [lm/W] | TOTAL LUMINOUS FLUX [lm] |
|---|---|---|---|---|---|---|
| RT 60 mA | 45 | 33 | 445 | 0.010712 | 6.803299 | 1.234288 |
| 60 ATMOSPHERE 60 mA | 46 | 34 | 445 | 0.009431 | 6.317462 | 1.125867 |
| 60-90 60 mA | 45 | 34 | 446 | 0.009542 | 6.024017 | 1.099665 |
| 60-90 30 mA | 44 | 33 | 445 | 0.008377 | 5.300151 | 0.972471 |

TABLE 1-continued

| Condition | | | | | | | | |
|---|---|---|---|---|---|---|---|---|
| 60-90 NOT ON | 46 | 626 | 0.0000227 | 0.000887 | 34 | 446 | 5.297202 | 0.982006 |
| RT 60 mA | 45 | 626 | 0.0000238 | 0.000931 | 34 | 446 | 3.993342 | 0.720036 |
| 60 ATMOSPHERE 60 mA | 45 | 626 | 0.0000220 | 0.000861 | 33 | 445 | 4.557058 | 0.796676 |
| 60-90 60 mA | 45 | 625 | 0.0000235 | 0.000907 | 33 | 446 | 4.291789 | 0.743772 |
| 60-90 30 mA | 46 | 626 | 0.0000250 | 0.000983 | 33 | 446 | 4.495346 | 0.777971 |
| 60-90 NOT ON | 45 | 627 | 0.0000254 | 0.000993 | 34 | 446 | 5.236708 | 0.905877 |
| RT 60 mA | 43 | 629 | 0.0000323 | 0.001199 | 31 | 445 | 9.349181 | 1.640419 |
| 60 ATMOSPHERE 60 mA | 43 | 629 | 0.0000258 | 0.000981 | 32 | 445 | 8.825713 | 1.527208 |
| 60-90 60 mA | 9 | 621 | 0.0000012 | 0.000089 | 70 | 445 | 3.247443 | 0.558714 |
| 60-90 30 mA | 9 | 626 | 0.0000012 | 0.000083 | 69 | 444 | 2.517846 | 0.456634 |
| 60-90 NOT ON | 47 | 626 | 0.0000212 | 0.000840 | 33 | 445 | 5.661649 | 0.980252 |
| RT 60 mA | 44 | 628 | 0.0000286 | 0.001099 | 32 | 445 | 6.263972 | 1.090666 |
| 60 ATMOSPHERE 60 mA | 42 | 630 | 0.0000207 | 0.000773 | 31 | 445 | 6.170710 | 1.068242 |
| 60-90 60 mA | 9 | 580 | 0.0000006 | 0.000000 | 82 | 445 | 1.269261 | 0.226552 |
| 60-90 30 mA | 13 | 581 | 0.0000019 | 0.000130 | 66 | 445 | 2.305427 | 0.398572 |
| 60-90 NOT ON | 45 | 626 | 0.0000260 | 0.001014 | 33 | 446 | 5.704682 | 0.983647 |
| RT 60 mA | 43 | 629 | 0.0000303 | 0.001136 | 31 | 445 | 9.233728 | 1.605952 |
| 60 ATMOSPHERE 60 mA | 42 | 630 | 0.0000228 | 0.000862 | 31 | 445 | 8.327016 | 1.438285 |
| 60-90 60 mA | 47 | 627 | 0.0000202 | 0.000818 | 33 | 446 | 5.526385 | 0.952373 |
| 60-90 NOT ON | 43 | 630 | 0.0000253 | 0.000963 | 32 | 446 | 5.662095 | 0.979023 |
| RT 60 mA | 42 | 631 | 0.0000176 | 0.000659 | 31 | 445 | 5.249773 | 0.910596 |
| 60 ATMOSPHERE 60 mA | 45 | 627 | 0.0000238 | 0.000943 | 34 | 446 | 5.345209 | 0.911598 |
| 60-90 60 mA | 42 | 629 | 0.0000296 | 0.001095 | 31 | 445 | 8.995316 | 1.562622 |
| 60-90 NOT ON | 42 | 630 | 0.0000212 | 0.000797 | 32 | 445 | 7.916904 | 1.353958 |
| RT 60 mA | 47 | 627 | 0.0000195 | 0.000795 | 34 | 446 | 5.333972 | 0.945267 |
| 60 ATMOSPHERE 60 mA | 43 | 630 | 0.0000245 | 0.000921 | 32 | 445 | 5.282379 | 0.918929 |
| 60-90 60 mA | 42 | 630 | 0.0000150 | 0.000557 | 31 | 445 | 4.382666 | 0.744848 |
| 60-90 NOT ON | 45 | 627 | 0.0000230 | 0.000921 | 34 | 446 | 5.267036 | 0.894614 |
| RT 60 mA | 43 | 630 | 0.0000276 | 0.001023 | 31 | 445 | 8.672344 | 1.479071 |
| 60 ATMOSPHERE 60 mA | 42 | 630 | 0.0000190 | 0.000717 | 31 | 445 | 7.177321 | 1.225431 |
| 60-90 60 mA | 47 | 627 | 0.0000188 | 0.000778 | 34 | 446 | 5.343000 | 0.913735 |
| RT 60 mA | 43 | 630 | 0.0000209 | 0.000784 | 31 | 445 | 4.485485 | 0.767409 |
| 50 ATMOSPHERE 60 mA | 43 | 631 | 0.0000117 | 0.000439 | 31 | 445 | 3.484425 | 0.593527 |
| 60-90 NOT ON | 45 | 627 | 0.0000225 | 0.000900 | 33 | 446 | 5.023353 | 0.855408 |

Figure 15:
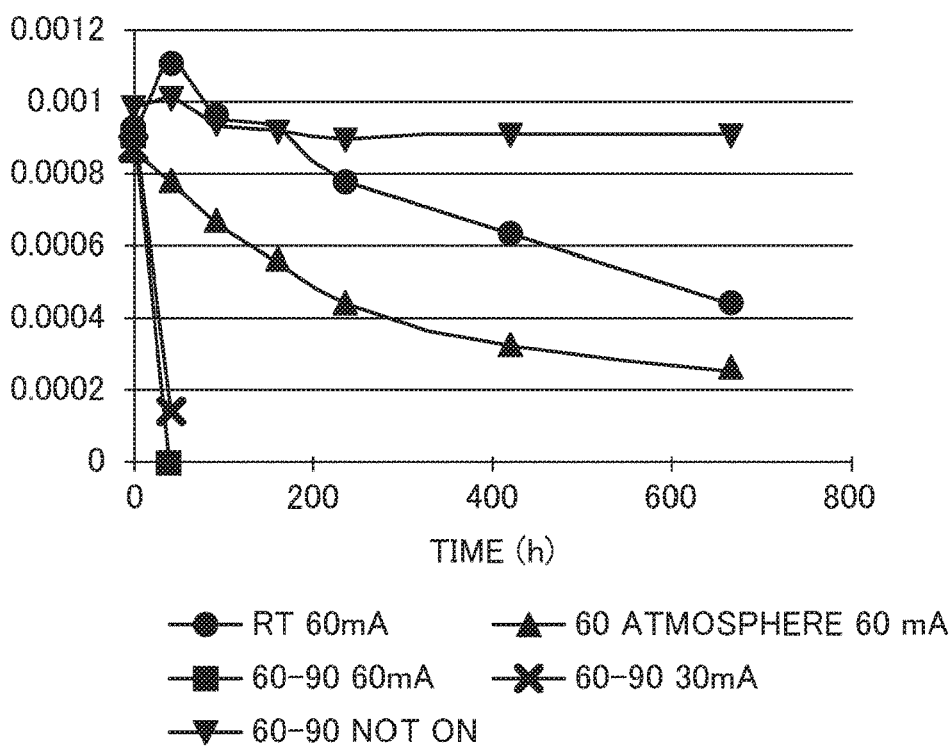
FIG. 15 is a graph illustrating a time variation in light emission intensity under each condition of sample 1-1 (red area)
Figure 16:
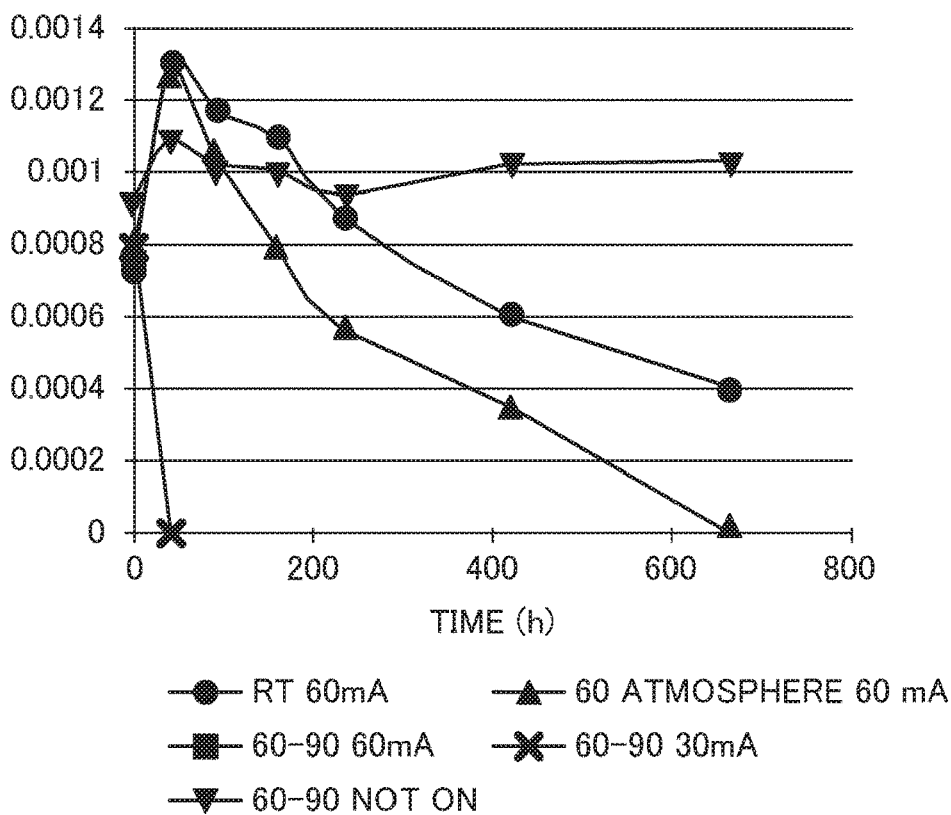
FIG. 16 is a graph illustrating a time variation in light emission intensity under each condition of sample 1-1 (green area)
Figure 29:
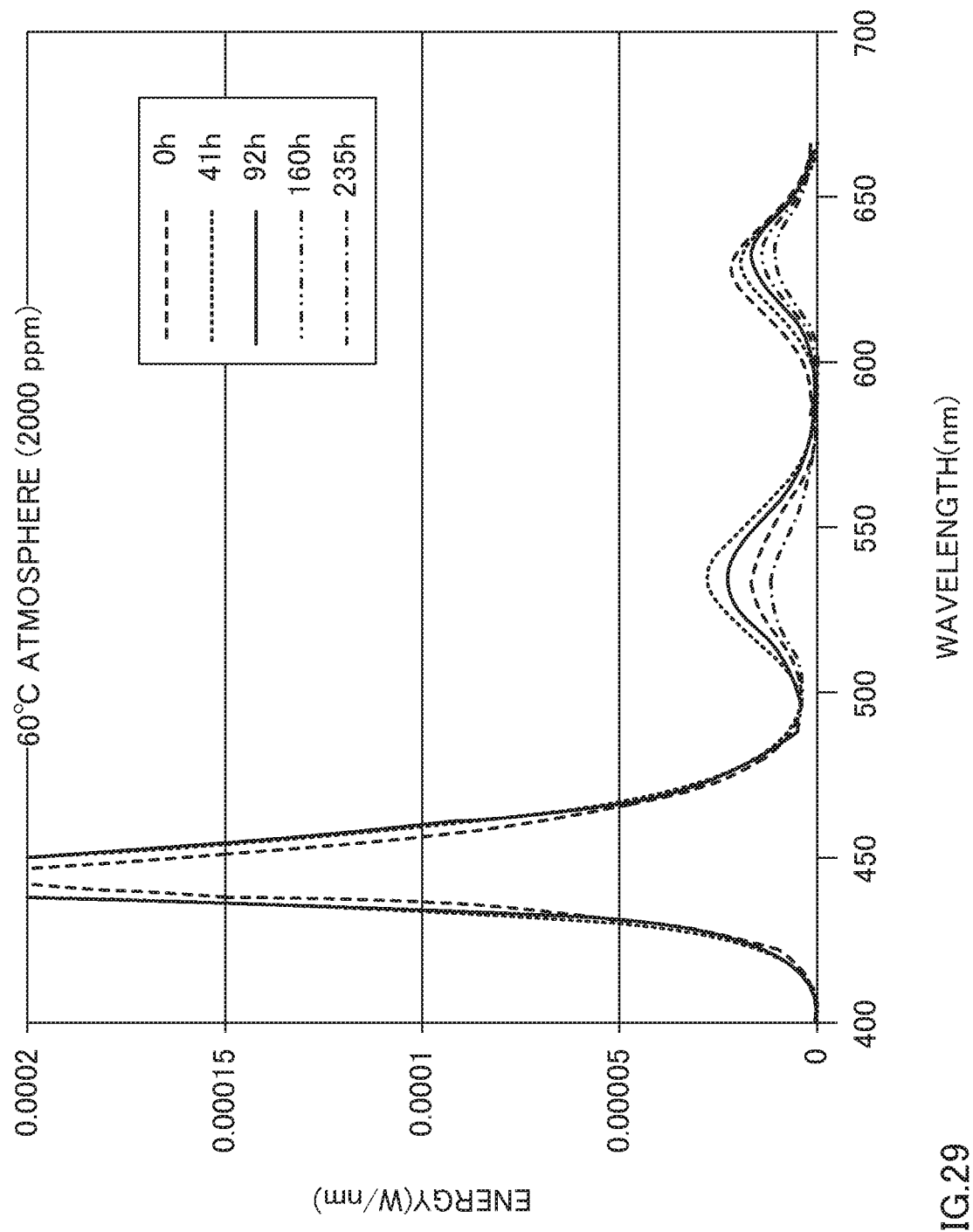
FIG. 29 is a light emission spectrum when sample 1-1 is measured after 0 hours, 41 hours, 92 hours, 160 hours and 235 hours under a condition of 60° C. atmosphere.

FIG. 29 illustrates an example of light emission spectrum. FIG. 29 shows a light emission spectrum of sample 1-1 measured under a condition of 60° C. atmosphere, with elapsed times of 0, 41, 92, 160 and 235 hours. A light emission spectrum over time under other durability test conditions was also obtained and the results were summarized in above Table 1. Note that although Table 1 and FIG. 29 describe results of elapsed times of up to 235 hours, time variations in light emission intensity exceeding 600 hours were actually measured. FIG. 15 and FIG. 16 show the experiment results.

FIG. 15 is a graph illustrating a time variation in light emission intensity of sample 1-1 (red area) under each condition and FIG. 16 is a graph illustrating a time variation in light emission intensity of sample 1-1 (green area) under each condition.

Table 2 below shows experiment results of samples 2-1 and 2-2.

TABLE 2

| SAMPLE NAME | COMMENT | TIME (h) | GRAPH CLASSIFICATION | REMARKS | GREEN PEAK WAVELENGTH (nm) | GREEN PEAK INTENSITY | GREEN PEAK AREA |
|---|---|---|---|---|---|---|---|
| WITH StCa 60 mA | 60-90 60 mA | 0 | 60-90 | 60 mA ON | 535 | 0.0000176 | 0.000918 |
| WITH StCa 30 mA | 60-90 30 mA | 0 | 60-90 | 30 mA ON | 535 | 0.0000249 | 0.001235 |
| WITH StCa NOT ON | 60-90 NOT ON | 0 | 60-90 | NOT ON | 535 | 0.0000171 | 0.000809 |
| WITH StCa RT | RT 60 mA | 0 | ATMOSPHERE ON | 60 mA ON | 535 | 0.0000191 | 0.000918 |
| WITH StCa 60° C | 60 ATMOSPHERE 60 mA | 0 | ATMOSPHERE ON | 60 mA ON | 534 | 0.0000163 | 0.000844 |
| No StCa 60 mA | 60-90 60 mA | 0 | 60-90 | 60 mA ON | 534 | 0.0000202 | 0.001033 |
| No StCa 30 mA | 60-90 30 mA | 0 | 60-90 | 30 mA ON | 534 | 0.0000178 | 0.000934 |
| No StCa NOT ON | 60-90 NOT ON | 0 | 60-90 | NOT ON | 533 | 0.0000147 | 0.000694 |
| No StCa RT | RT 60 mA | 0 | ATMOSPHERE ON | 60 mA ON | 533 | 0.0000144 | 0.000675 |
| NO StCa 60° C | 60 ATMOSPHERE 60 mA | 0 | ATMOSPHERE ON | 60 mA ON | 533 | 0.0000137 | 0.000713 |
| FIRST TIME 2000 ppm RETRY 60 mA | 60-90 60 mA 2000 ppm RETRY | 0 | 60-90 | 60 mA ON | 534 | 0.0000205 | 0.001026 |
| WITH StCa 60 mA | 60-90 60 mA | 16 | 60-90 | 60 mA ON | 490 | 0.0000091 | 0 |
| WITH StCa 30 mA | 60-90 30 mA | 16 | 60-90 | 30 mA ON | 527 | 0.0000134 | 0.000669 |
| WITH StCa NOT ON | 60-90 NOT ON | 16 | 60-90 | NOT ON | 534 | 0.0000158 | 0.000769 |
| WITH StCa RT | RT 60 mA | 16 | ATMOSPHERE ON | 60 mA ON | 536 | 0.0000417 | 0.001943 |
| WITH StCa 60° C | 60 ATMOSPHERE 60 mA | 16 | ATMOSPHERE ON | 60 mA ON | 535 | 0.0000394 | 0.001832 |
| No StCa 60 mA | 60-90 60 mA | 16 | 60-90 | 60 mA ON | 490 | 0.0000106 | 0 |
| No StCa 30 mA | 60-90 30 mA | 16 | 60-90 | 30 mA ON | 490 | 0.0000086 | 0 |
| No StCa NOT ON | 60-90 NOT ON | 16 | 60-90 | NOT ON | 535 | 0.0000156 | 0.0007694 |
| No StCa RT | RT 60 mA | 16 | ATMOSPHERE ON | 60 mA ON | 535 | 0.0000254 | 0.0011648 |
| NO StCa 60° C | 60 ATMOSPHERE 60 mA | 16 | ATMOSPHERE ON | 60 mA ON | 535 | 0.0000221 | 0.0010414 |
| FIRST TIME 2000 ppm RETRY 60 mA | 60-90 60 mA 2000 ppm RETRY | 16 | 60-90 | 60 mA ON | 490 | 0.0000089 | 0 |
| WITH StCa 60 mA | 60-90 60 mA | 90 | 60-90 | 60 mA ON | 490 | 0.0000096 | 0 |
| WITH StCa 30 mA | 60-90 30 mA | 90 | 60-90 | 30 mA ON | 490 | 0.0000115 | 0 |
| WITH StCa NOT ON | 60-90 NOT ON | 90 | 60-90 | NOT ON | 535 | 0.0000177 | 0.0008694 |
| WITH StCa RT | RT 60 mA | 90 | ATMOSPHERE ON | 60 mA ON | 536 | 0.0000460 | 0.0021105 |
| WITH StCa 60° C | 60 ATMOSPHERE 60 mA | 90 | ATMOSPHERE ON | 60 mA ON | 532 | 0.0000358 | 0.0016431 |
| No StCa 60 mA | 60-90 60 mA | 90 | 60-90 | 60 mA ON | 534 | 0.0000139 | 0.0007008 |
| No StCa 30 mA | 60-90 30 mA | 90 | 60-90 | 30 mA ON | 535 | 0.0000200 | 0.0009151 |
| No StCa NOT ON | 60-90 NOT ON | 90 | 60-90 | NOT ON | 532 | 0.0000211 | 0.0009807 |
| WITH StCa NOT ON | 60-90 NOT ON | 160 | 60-90 | NOT ON | 533 | 0.0000185 | 0.0009024 |
| WITH StCa RT | RT 60 mA | 160 | ATMOSPHERE ON | 60 mA ON | 534 | 0.0000439 | 0.0019995 |
| WITH StCa 60° C | 60 ATMOSPHERE 60 mA | 160 | ATMOSPHERE ON | 60 mA ON | 530 | 0.0000100 | 0.0004502 |
| No StCa NOT ON | 60-90 NOT ON | 160 | 60-90 | NOT ON | 535 | 0.0000129 | 0.0006622 |
| No StCa RT | RT 60 mA | 160 | ATMOSPHERE ON | 60 mA ON | 532 | 0.0000177 | 0.0008148 |
| NO StCa 60° C | 60 ATMOSPHERE 60 mA | 160 | ATMOSPHERE ON | 60 mA ON | 535 | 0.0000191 | 0.0008784 |
| WITH StCa NOT ON | 60-90 NOT ON | 523 | 60-90 | NOT ON | 535 | 0.0000184 | 0.0008976 |
| WITH StCa RT | RT 60 mA | 523 | ATMOSPHERE ON | 60 mA ON | 533 | 0.0000378 | 0.0017182 |
| WITH StCa 60° C | 60 ATMOSPHERE 60 mA | 523 | ATMOSPHERE ON | 60 mA ON | 528 | 0.0000129 | 0.0005967 |
| No StCa NOT ON | 60-90 NOT ON | 523 | 60-90 | NOT ON | 535 | 0.0000112 | 0.0005616 |
| No StCa RT | RT 60 mA | 523 | ATMOSPHERE ON | 60 mA ON | 532 | 0.0000151 | 0.0006859 |
| NO StCa 60° C | 60 ATMOSPHERE 60 mA | 523 | ATMOSPHERE ON | 60 mA ON | 532 | 0.0000128 | 0.0005960 |

TABLE 2-continued

| SAMPLE NAME | GREEN HALF-VALUE WIDTH (nm) | RED PEAK WAVELENGTH (nm) | RED PEAK INTENSITY | RED PEAK AREA | RED HALF-VALUE WIDTH (nm) | EXCITATION LIGHT WAVELENGTH (nm) | EXCITATION LIGHT AREA | LIGHT EMISSION EFFICIENCY [lm/W] | TOTAL LUMINOUS FLUX [lm] |
|---|---|---|---|---|---|---|---|---|---|
| WITH StCa 60 mA | 52 | 626 | 0.0000248 | 0.001016 | 34 | 446 | 0.004749 | 5.280059 | 0.907280 |
| WITH StCa 30 mA | 48 | 627 | 0.0000341 | 0.001357 | 34 | 445 | 0.006267 | 6.908252 | 1.206617 |
| WITH StCa NOT ON | 46 | 627 | 0.0000244 | 0.000943 | 34 | 446 | 0.006766 | 5.239500 | 0.888772 |
| WITH StCa RT | 45 | 626 | 0.0000290 | 0.001135 | 33 | 446 | 0.005222 | 5.574886 | 0.948742 |
| WITH StCa 60° C | 54 | 627 | 0.0000223 | 0.000917 | 34 | 445 | 0.005292 | 4.981304 | 0.856424 |
| No StCa 60 mA | 50 | 627 | 0.0000257 | 0.001044 | 34 | 445 | 0.007598 | 6.002914 | 1.041193 |
| No StCa 30 mA | 54 | 627 | 0.0000219 | 0.000907 | 34 | 444 | 0.006729 | 5.329695 | 0.918784 |
| No StCa NOT ON | 46 | 627 | 0.0000189 | 0.000732 | 33 | 445 | 0.007521 | 4.417125 | 0.768209 |
| No StCa RT | 48 | 627 | 0.0000201 | 0.000775 | 34 | 445 | 0.007636 | 4.581739 | 0.783506 |
| NO StCa 60° C | 71 | 627 | 0.0000172 | 0.000729 | 33 | 446 | 0.005663 | 4.196566 | 0.757056 |
| FIRST TIME 2000 ppm RETRY 60 mA | 48 | 627 | 0.0000277 | 0.001115 | 34 | 446 | 0.003783 | 5.396642 | 0.960721 |
| WITH StCa 60 mA | 16 | 628 | 0.0000098 | 0.000413 | 34 | 445 | 0.009141 | 2.877867 | 0.494567 |
| WITH StCa 30 mA | 64 | 628 | 0.0000242 | 0.000927 | 32 | 445 | 0.011097 | 4.913075 | 0.887168 |
| WITH StCa NOT ON | 48 | 627 | 0.0000255 | 0.000978 | 32 | 446 | 0.006405 | 4.855154 | 0.858445 |
| WITH StCa RT | 43 | 628 | 0.0000405 | 0.001555 | 32 | 446 | 0.005611 | 9.477166 | 1.659095 |
| WITH StCa 60° C | 43 | 629 | 0.0000273 | 0.001043 | 31 | 445 | 0.007231 | 8.483070 | 1.500969 |
| No StCa 60 mA | 12 | 627 | 0.0000021 | 0.000145 | 72 | 444 | 0.014692 | 2.993103 | 0.544424 |
| No StCa 30 mA | 17 | 629 | 0.0000021 | 0.000152 | 73 | 443 | 0.011790 | 2.636867 | 0.467248 |
| No StCa NOT ON | 47 | 627 | 0.0000181 | 0.000723 | 33 | 445 | 0.006371 | 4.400288 | 0.778178 |
| No StCa RT | 44 | 629 | 0.0000227 | 0.000856 | 32 | 445 | 0.007962 | 6.296877 | 1.085817 |
| NO StCa 60° C | 45 | 630 | 0.0000176 | 0.000700 | 33 | 446 | 0.007125 | 5.613560 | 0.964300 |
| FIRST TIME 2000 ppm RETRY 60 mA | 13 | 625 | 0.0000020 | 0.000137 | 71 | 445 | 0.010257 | 2.523555 | 0.435049 |
| WITH StCa 60 mA | 10 | 580 | 0.0000012 | 0.000000 | 72 | 445 | 0.012295 | 2.587598 | 0.444087 |
| WITH StCa 30 mA | 10 | 624 | 0.0000029 | 0.000165 | 46 | 445 | 0.016115 | 3.290306 | 0.565801 |
| WITH StCa NOT ON | 47 | 627 | 0.0000255 | 0.001006 | 33 | 446 | 0.005587 | 5.068178 | 0.898528 |
| WITH StCa RT | 43 | 629 | 0.0000395 | 0.001492 | 32 | 446 | 0.005761 | 10.156078 | 1.722674 |
| WITH StCa 60° C | 43 | 630 | 0.0000211 | 0.000805 | 31 | 445 | 0.008628 | 7.760513 | 1.329635 |
| No StCa 60 mA | 49 | 628 | 0.0000161 | 0.000673 | 34 | 445 | 0.005070 | 3.845607 | 0.698393 |
| No StCa 30 mA | 43 | 630 | 0.0000205 | 0.000759 | 32 | 445 | 0.007841 | 5.335926 | 0.904669 |
| No StCa NOT ON | 44 | 631 | 0.0000147 | 0.000581 | 33 | 446 | 0.007647 | 5.235426 | 0.903222 |
| WITH StCa NOT ON | 47 | 627 | 0.0000241 | 0.000955 | 33 | 446 | 0.005059 | 5.209650 | 0.892179 |
| WITH StCa RT | 43 | 629 | 0.0000375 | 0.001407 | 32 | 446 | 0.005777 | 9.598700 | 1.633024 |
| WITH StCa 60° C | 48 | 631 | 0.0000101 | 0.000383 | 32 | 445 | 0.006877 | 3.086920 | 0.526169 |
| No StCa NOT ON | 49 | 628 | 0.0000148 | 0.000630 | 35 | 445 | 0.004535 | 3.701075 | 0.646252 |
| WITH StCa RT | 43 | 630 | 0.0000196 | 0.000719 | 32 | 445 | 0.007802 | 4.845653 | 0.822520 |
| WITH StCa 60° C | 43 | 631 | 0.0000131 | 0.000520 | 33 | 446 | 0.007888 | 4.862974 | 0.836706 |
| WITH StCa NOT ON | 46 | 628 | 0.0000213 | 0.000866 | 33 | 447 | 0.004085 | 4.608143 | 0.838659 |
| WITH StCa RT | 43 | 630 | 0.0000324 | 0.001213 | 32 | 446 | 0.006031 | 8.264959 | 1.412551 |
| WITH StCa 60° C | 58 | 631 | 0.0000097 | 0.000385 | 33 | 445 | 0.009715 | 3.949004 | 0.680410 |
| No StCa NOT ON | 49 | 628 | 0.0000128 | 0.000548 | 35 | 444 | 0.003676 | 3.155570 | 0.549997 |
| WITH StCa RT | 43 | 631 | 0.0000185 | 0.000679 | 31 | 446 | 0.007934 | 4.373495 | 0.754944 |
| NO StCa 60° C | 48 | 632 | 0.0000089 | 0.000363 | 34 | 446 | 0.007767 | 3.688968 | 0.638253 |

Figure 17:
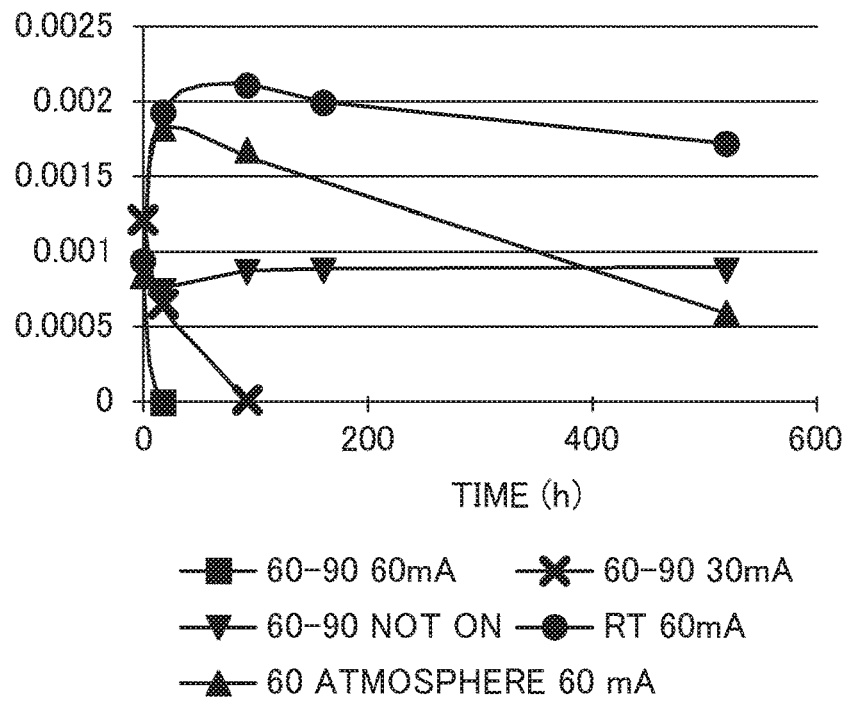
FIG. 17 is a graph illustrating a time variation in light emission intensity under each condition of sample 2-1 (green area)
Figure 18:
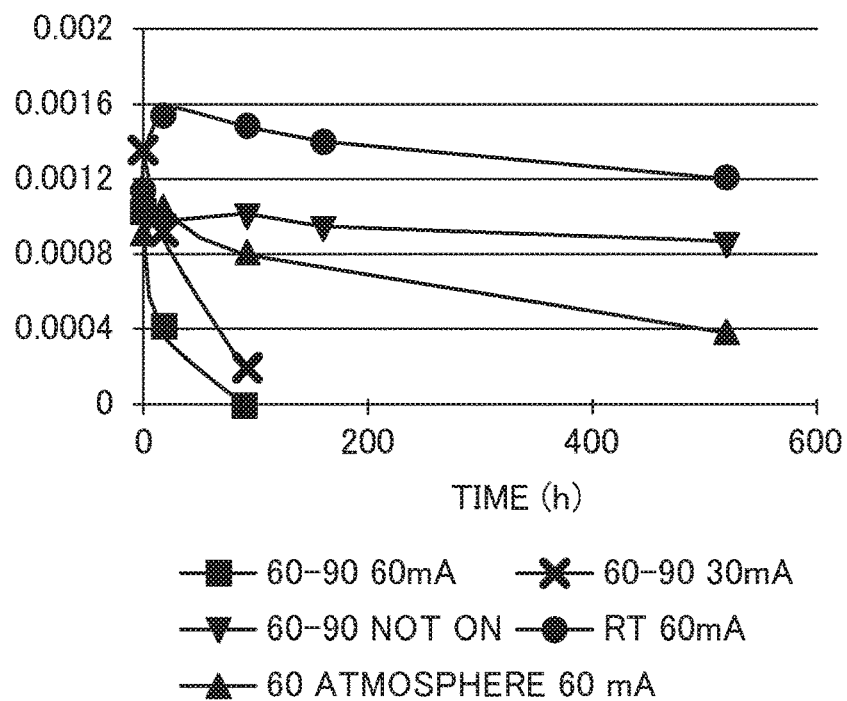
FIG. 18 is a graph illustrating a time variation in light emission intensity under each condition of sample 2-1 (red area)
Figure 19:
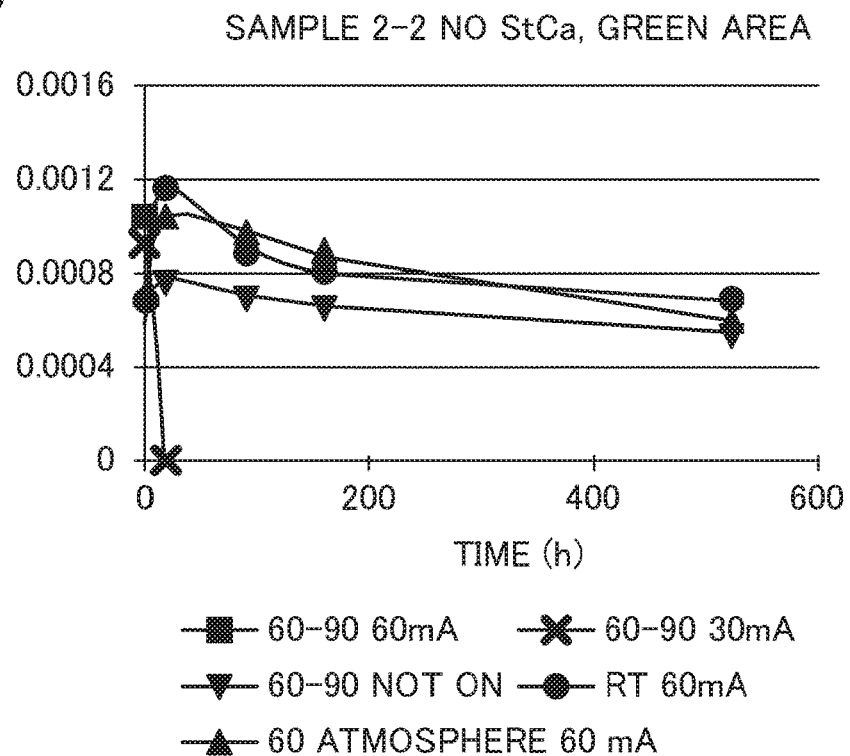
FIG. 19 is a graph illustrating a time variation in light emission intensity under each condition of sample 2-2 (green area)
Figure 20:
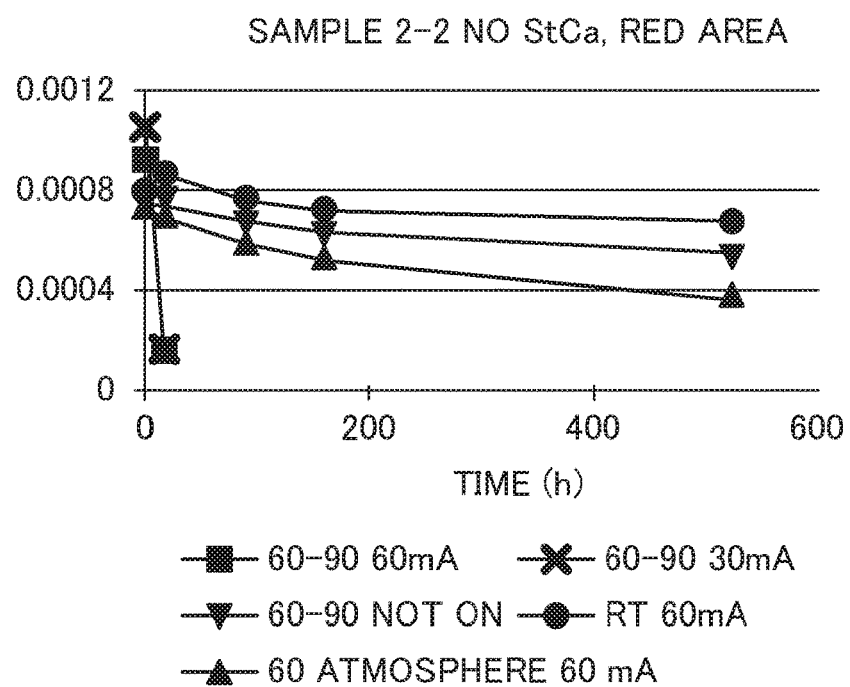
FIG. 20 is a graph illustrating a time variation in light emission intensity under each condition of sample 2-2 (red area)

FIG. 17 is a graph illustrating a time variation in light emission intensity of sample 2-1 (green area) under each condition. FIG. 18 is a graph illustrating a time variation in light emission intensity of sample 2-1 (red area) under each condition. FIG. 19 is a graph illustrating a time variation in light emission intensity of sample 2-2 (green area) under each condition. FIG. 20 is a graph illustrating a time variation in light emission intensity of sample 2-2 (red area) under each condition.

Next, Table 3 below shows experiment results when sample 3 was irradiated with light emitted under a temperature of 60° C., humidity of 90% and at 30 mA, and Table 4 shows experiment results under other conditions.

TABLE 3

| SAMPLE NAME | COMMENT | TIME (h) | REMARKS | GREEN PEAK WAVELENGTH (nm) | GREEN PEAK AREA |
|---|---|---|---|---|---|
| sample 1-1 | 1st | 0 | 30 mA ON | 534 | 0.001174 |
| sample 2-1 | 2nd | 0 | 30 mA ON | 535 | 0.000852 |
| sample 3 | 3rd | 0 | 30 mA ON | 533 | 0.001070 |
| sample 1-1 | 1st | 6 | 30 mA ON | 531 | 0.000833 |
| sample 2-1 | 2nd | 6 | 30 mA ON | 530 | 0.001018 |
| sample 3 | 3rd | 6 | 30 mA ON | 532 | 0.000830 |
| sample 1-1 | 1st | 19 | 30 mA ON | 490 | 0 |
| sample 2-1 | 2nd | 19 | 30 mA ON | 490 | 0 |
| sample 3 | 3rd | 19 | 30 mA ON | 490 | 0 |
| sample 1-1 | 1st | 43 | 30 mA ON | 490 | 0 |
| sample 2-1 | 2nd | 43 | 30 mA ON | 490 | 0 |
| sample 3 | 3rd | 43 | 30 mA ON | 490 | 0 |
| sample 1-1 | 1st | 70 | 30 mA ON | 490 | 0 |
| sample 2-1 | 2nd | 70 | 30 mA ON | 490 | 0 |
| sample 3 | 3rd | 70 | 30 mA ON | 490 | 0 |

| SAMPLE NAME | GREEN HALF-VALUE WIDTH (nm) | RED PEAK WAVE-LENGTH (nm) | RED PEAK AREA | RED HALF-VALUE WIDTH (nm) | EXCITATION LIGHT WAVE-LENGTH (nm) | EXCITATION LIGHT AREA | LIGHT EMISSION EFFICIENCY [lm/W] | TOTAL LUMINOUS FLUX [lm] |
|---|---|---|---|---|---|---|---|---|
| sample 1-1 | 43 | 625 | 0.001245 | 33 | 445 | 0.004170 | 6.237870 | 1.075474 |
| sample 2-1 | 46 | 626 | 0.000971 | 33 | 446 | 0.005431 | 5.027159 | 0.874938 |
| sample 3 | 46 | 626 | 0.001203 | 34 | 445 | 0.007055 | 6.399195 | 1.092613 |
| sample 1-1 | 47 | 629 | 0.000681 | 31 | 445 | 0.008232 | 4.876146 | 0.838764 |
| sample 2-1 | 46 | 628 | 0.000928 | 32 | 445 | 0.006763 | 5.646894 | 0.971158 |
| sample 3 | 50 | 628 | 0.001030 | 31 | 445 | 0.008908 | 5.514578 | 0.938792 |
| sample 1-1 | 14 | 627 | 0.000198 | 36 | 444 | 0.012484 | 2.919376 | 0.502875 |
| sample 2-1 | 61 | 628 | 0.000496 | 32 | 445 | 0.008174 | 3.187827 | 0.546200 |
| sample 3 | 45 | 629 | 0.000452 | 33 | 445 | 0.013290 | 3.723622 | 0.633726 |
| sample 1-1 | 10 | 625 | 0.000082 | 72 | 444 | 0.013419 | 2.573664 | 0.443293 |
| sample 2-1 | 12 | 626 | 0.000250 | 35 | 445 | 0.010769 | 2.726104 | 0.466771 |
| sample 3 | 12 | 628 | 0.000238 | 36 | 445 | 0.015104 | 3.355242 | 0.570699 |
| sample 1-1 | 10 | 581 | 0.000071 | 66 | 444 | 0.013235 | 2.517751 | 0.432032 |
| sample 2-1 | 11 | 627 | 0.000146 | 43 | 445 | 0.011718 | 2.596728 | 0.444422 |
| sample 3 | 10 | 628 | 0.000149 | 51 | 445 | 0.015928 | 3.222996 | 0.547856 |

TABLE 4

| SAMPLE NAME | COMMENT | TIME (h) | REMARKS | GREEN PEAK WAVELENGTH (nm) | GREEN PEAK AREA |
|---|---|---|---|---|---|
| 60-90 60 mA ON | Hex | 0 | 60 mA ON | 534 | 0.001004 |
| 60-90 NOT ON | Hex | 0 | NOT ON | 534 | 0.001217 |
| RT 60 mA ON | Hex | 0 | 60 mA ON | 534 | 0.000989 |
| 60 ATMOSPHERE 60 mA ON | Hex | 0 | 60 mA ON | 534 | 0.001056 |
| 60-90 60 mA ON | Hex | 19 | 60 mA ON | 490 | 0 |
| 60-90 NOT ON | Hex | 19 | NOT ON | 533 | 0.001359 |
| RT 60 mA ON | Hex | 19 | 60 mA ON | 536 | 0.001570 |
| 60 ATMOSPHERE 60 mA ON | Hex | 19 | 60 mA ON | 536 | 0.001802 |
| 60-90 60 mA ON | Hex | 39 | 60 mA ON | 490 | 0 |
| 60-90 NOT ON | Hex | 39 | NOT ON | 535 | 0.001313 |
| RT 60 mA ON | Hex | 39 | 60 mA ON | 537 | 0.001608 |
| 60 ATMOSPHERE 60 mA ON | Hex | 39 | 60 mA ON | 536 | 0.001909 |
| 60-90 60 mA ON | Hex | 88 | 60 mA ON | 490 | 0 |
| 60-90 NOT ON | Hex | 88 | NOT ON | 535 | 0.001377 |
| RT 60 mA ON | Hex | 88 | 60 mA ON | 536 | 0.001743 |
| 60 ATMOSPHERE 60 mA ON | Hex | 88 | 60 mA ON | 536 | 0.001982 |
| 60-90 NOT ON | Hex | 165 | NOT ON | 535 | 0.001371 |
| RT 60 mA ON | Hex | 165 | 60 mA ON | 535 | 0.001826 |

TABLE 4-continued

| | | | | | | | | |
|---|---|---|---|---|---|---|---|---|
| 60 ATMOSPHERE 60 mA ON | Hex | 165 | 60 mA ON | | 535 | | | 0.001964 |
| 60-90 NOT ON | Hex | 262 | NOT ON | | 535 | | | 0.001248 |
| RT 60 mA ON | Hex | 262 | 60 mA ON | | 535 | | | 0.001832 |
| 60 ATMOSPHERE 60 mA ON | Hex | 262 | 60 mA ON | | 535 | | | 0.001891 |

| SAMPLE NAME | GREEN HALF-VALUE WIDTH (nm) | RED PEAK WAVE-LENGTH (nm) | RED PEAK AREA | RED HALF-VALUE WIDTH (nm) | EXCITATION LIGHT WAVE-LENGTH (nm) | EXCITATION LIGHT AREA | LIGHT EMISSION EFFICIENCY [lm/W] | TOTAL LUMINOUS FLUX [m] |
|---|---|---|---|---|---|---|---|---|
| 60-90 60 mA ON | 44 | 626 | 0.001052 | 33 | 445 | 0.007676 | 6.065723 | 1.041244 |
| 60-90 NOT ON | 44 | 626 | 0.001272 | 34 | 445 | 0.007204 | 6.930717 | 1.193018 |
| RT 60 mA ON | 45 | 625 | 0.001030 | 34 | 445 | 0.008797 | 6.151587 | 1.051387 |
| 60 ATMOSPHERE 60 mA ON | 44 | 626 | 0.001055 | 34 | 444 | 0.006719 | 5.932898 | 1.023193 |
| 60-90 60 mA ON | 11 | 628 | 0.000241 | 34 | 445 | 0.012314 | 2.782612 | 0.477940 |
| 60-90 NOT ON | 44 | 626 | 0.001270 | 33 | 445 | 0.006375 | 6.964275 | 1.253319 |
| RT 60 mA ON | 43 | 628 | 0.001155 | 32 | 445 | 0.008539 | 8.322008 | 1.419300 |
| 60 ATMOSPHERE 60 mA ON | 43 | 629 | 0.001125 | 32 | 444 | 0.006882 | 8.680588 | 1.493393 |
| 60-90 60 mA ON | 10 | 627 | 0.000125 | 43 | 445 | 0.013540 | 2.729361 | 0.466460 |
| 60-90 NOT ON | 44 | 626 | 0.001257 | 33 | 445 | 0.006056 | 7.080454 | 1.215414 |
| RT 60 mA ON | 43 | 628 | 0.001117 | 32 | 445 | 0.008119 | 8.361491 | 1.421672 |
| 60 ATMOSPHERE 60 mA ON | 43 | 629 | 0.001101 | 32 | 444 | 0.006973 | 8.983096 | 1.543791 |
| 60-90 60 mA ON | 9 | 624 | 0.000075 | 70 | 445 | 0.013886 | 2.672744 | 0.456374 |
| 60-90 NOT ON | 45 | 627 | 0.001273 | 34 | 445 | 0.005666 | 7.207451 | 1.245468 |
| RT 60 mA ON | 43 | 629 | 0.001127 | 32 | 445 | 0.008248 | 8.806561 | 1.498058 |
| 60 ATMOSPHERE 60 mA ON | 43 | 629 | 0.001049 | 31 | 444 | 0.007058 | 9.183614 | 1.575884 |
| 60-90 NOT ON | 44 | 626 | 0.001258 | 34 | 445 | 0.005343 | 7.158549 | 1.230510 |
| RT 60 mA ON | 42 | 629 | 0.001126 | 32 | 445 | 0.008401 | 9.051997 | 1.541294 |
| 60 ATMOSPHERE 60 mA ON | 42 | 629 | 0.001017 | 31 | 444 | 0.007322 | 8.984315 | 1.546295 |
| 60-90 NOT ON | 45 | 627 | 0.001184 | 33 | 446 | 0.004920 | 6.512652 | 1.126485 |
| RT 60 mA ON | 42 | 630 | 0.001089 | 32 | 446 | 0.008285 | 8.992976 | 1.536733 |
| 60 ATMOSPHERE 60 mA ON | 42 | 630 | 0.000952 | 31 | 444 | 0.007393 | 8.635300 | 1.492157 |

Figure 21:
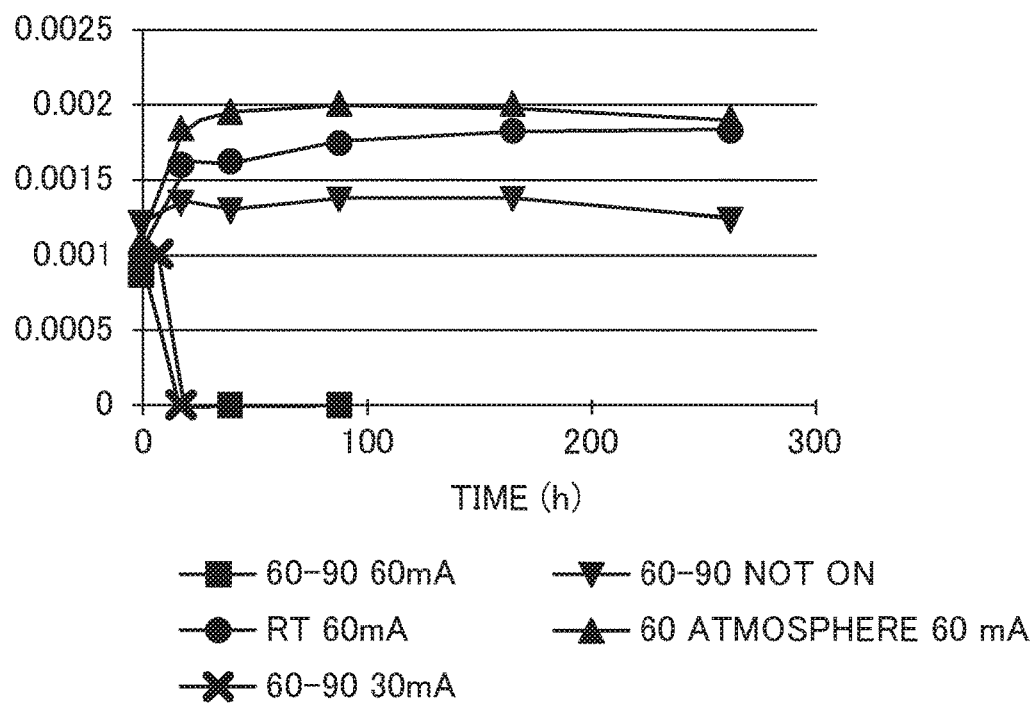
FIG. 21 is a graph illustrating a time variation in light emission intensity under each condition of sample 3 (green area)
Figure 22:
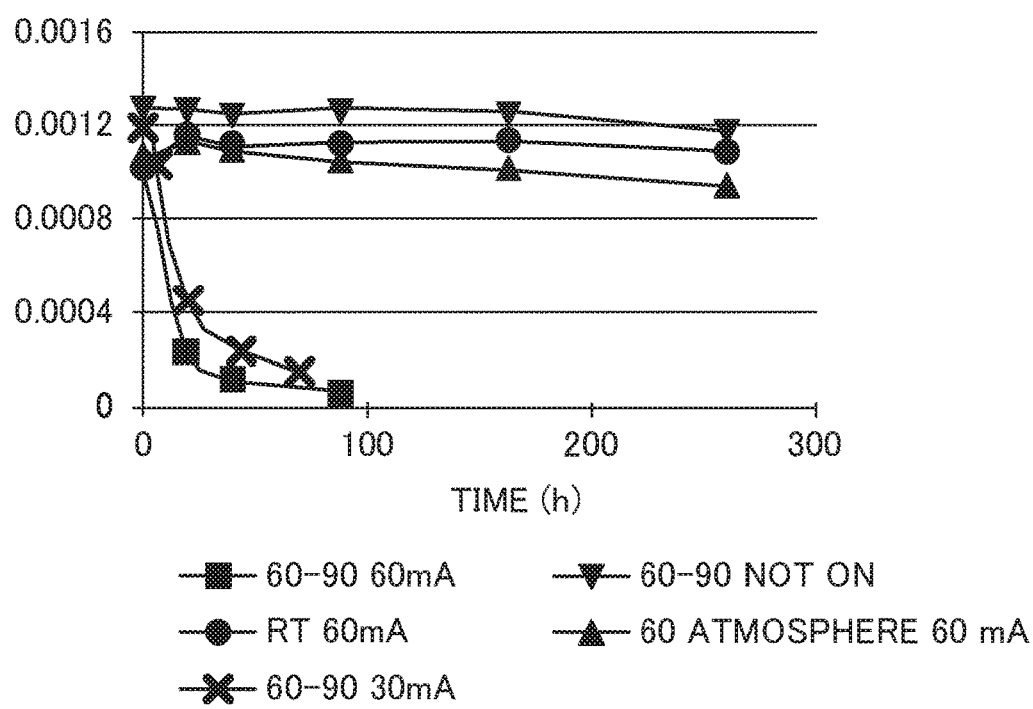
FIG. 22 is a graph illustrating a time variation in light emission intensity under each condition of sample 3 (red area)

FIG. 21 is a graph illustrating a time variation in light emission intensity of sample 3 (green area) under each condition. FIG. 22 is a graph illustrating a time variation in light emission intensity of sample 3 (red area) under each condition.

In each graph, the smaller the time variation in light emission intensity, that is, the gentler the gradient of reduction over an elapsed time, the more the durability against environmental variations improves. As is obvious from each graph, it is appreciated that when the LED is turned on under severe environmental conditions such as 60° C., 90RH, fluorescence intensity decreases rapidly. On the other hand, it is appreciated that when the LED is turned on indoors, when the LED is turned on under a 60° C. atmosphere or when the LED is not turned on, fluorescence intensity gradually attenuates or the initial intensity level can be maintained.

Next, a time variation in fluorescence intensity of sample 2-1 mixed with calcium stearate (StCa) was compared with that of sample 2-2 without being mixed with calcium stearate (StCa). FIG. 17 and FIG. 18 show experiment results of sample 2-1, and FIG. 19 and FIG. 20 show experiment results of sample 2-2. When the graphs are compared under the same condition, it is possible to appreciate that durability has improved in sample 2-1 mixed with calcium stearate (StCa) compared to sample 2-2 not mixed with calcium stearate (StCa). With the samples mixed with calcium stearate in particular, the peak areas of the green light and the red light remained 80% or more of those before testing under a temperature of 60° C., a humidity of 90% without turning on the LED even after a lapse of time of 200 hours. Furthermore, with these samples, the peak intensities of the green light and the red light remained 80% or more of those before testing under a temperature of 60° C., a humidity of 90% without turning on the LED even after a lapse of time of 200 hours.

Furthermore, the time variations in fluorescence intensity in FIG. 17 and FIG. 18 showing experiment results of sample 2-1 using organosilane as a solvent were compared with the time variations in fluorescence intensity in FIG. 21 and FIG. 22 showing experiment results of sample 3 using hexane as a solvent. When the graphs are compared under the same condition, it is possible to appreciate that durability has been likely to improve in sample 3 using hexane as the solvent compared with sample 2-1 using organosilane as the solvent. With the sample using hexane and mixed with calcium stearate, the peak areas of the green light and the red light remained 93% or more of those before testing under a temperature of 60° C., a humidity of 90% without turning on the LED even after a lapse of 200 hours.

[Injection Molding]
The following injection molding machine was used.
Electric injection molding machine: J110AD 110H
Name of manufacturer: Japan Steel Works, Ltd.
Specification: Injection pressure: 225 MPa
  Mold clamping force: 1080 kN
Pellets of samples 4-1 to 4-3 obtained through extrusion molding were introduced to an injection molding machine under a cylinder temperature of 200° C. to 240° C., injected into a physical property specimen creation metal die to mold a specimen of a predetermined shape.

[Durability Test on Injection Molded Product]
The respective specimens were heated to 90° C., 110° C., 130° C., respectively, and then annealed. The specimen in size of 5 cm×1 cm×4 mm was held by a sample holder, and subjected to a durability test under 60° C., 90RH. Influences of the above-described annealing were thereby studied.

Figure 23:
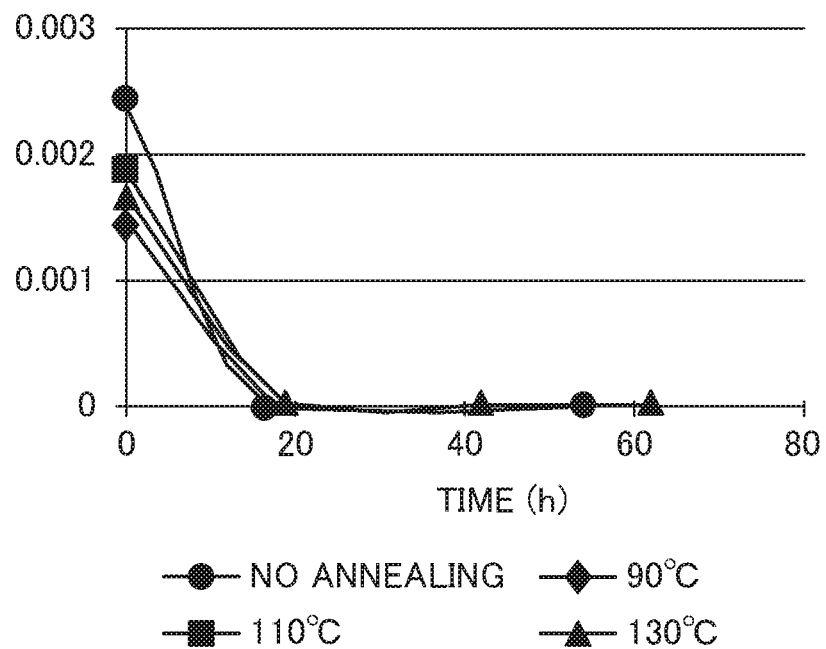
FIG. 23 is a graph illustrating a time variation in light emission intensity under each condition of sample 4-1 (green area)
Figure 24:
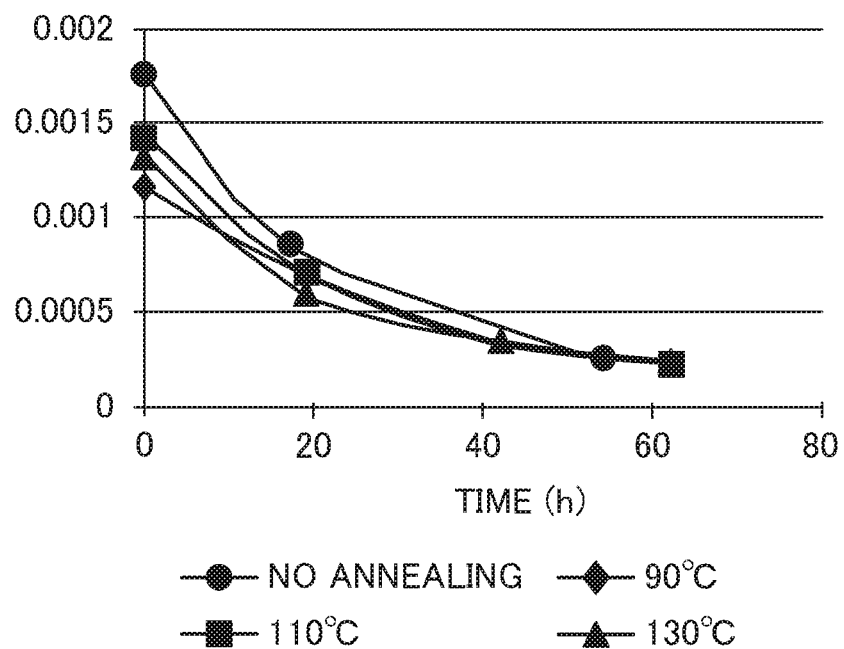
FIG. 24 is a graph illustrating a time variation in light emission intensity under each condition of sample 4-1 (red area)
Figure 25:
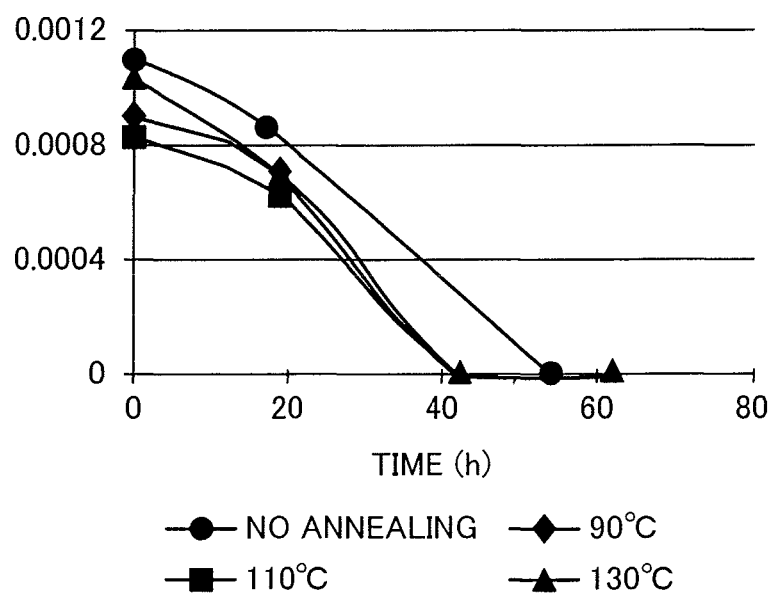
FIG. 25 is a graph illustrating a time variation in light emission intensity under each condition of sample 4-2 (green area)
Figure 26:
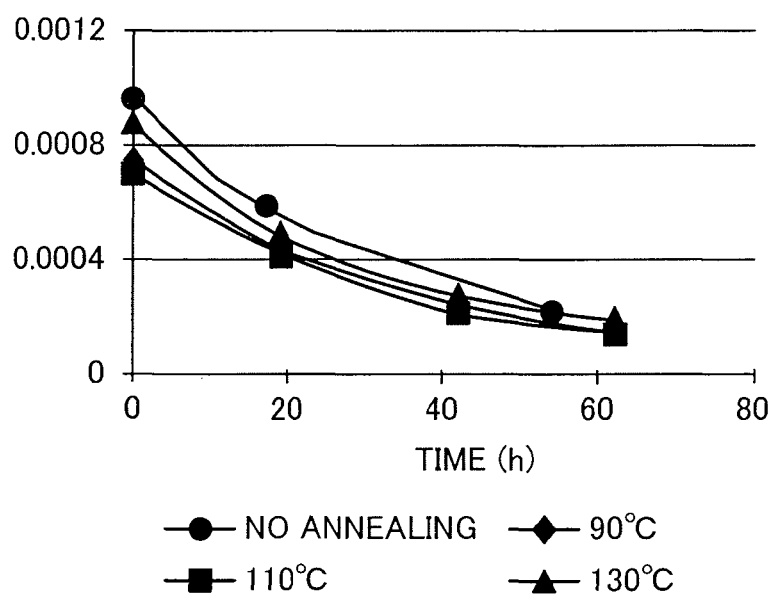
FIG. 26 is a graph illustrating a time variation in light emission intensity under each condition of sample 4-2 (red area)
Figure 27:
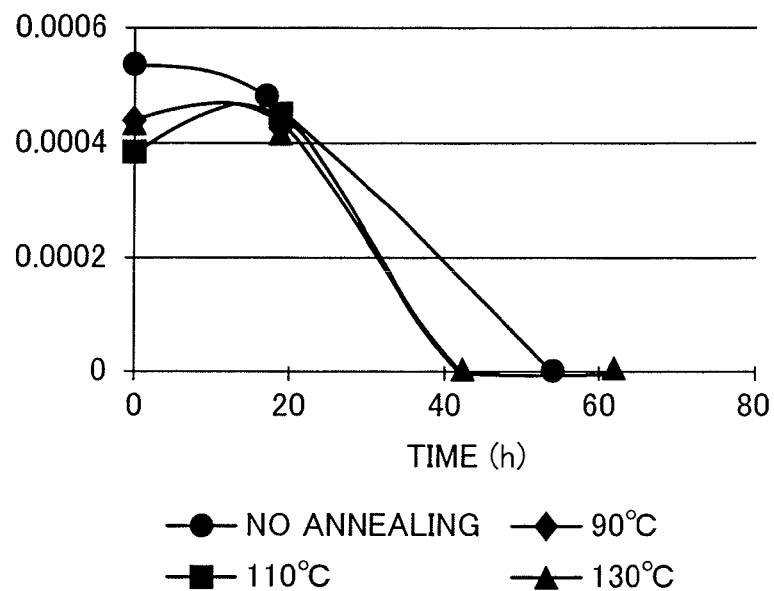
FIG. 27 is a graph illustrating a time variation in light emission intensity under each condition of sample 4-3 (green area)
Figure 28:
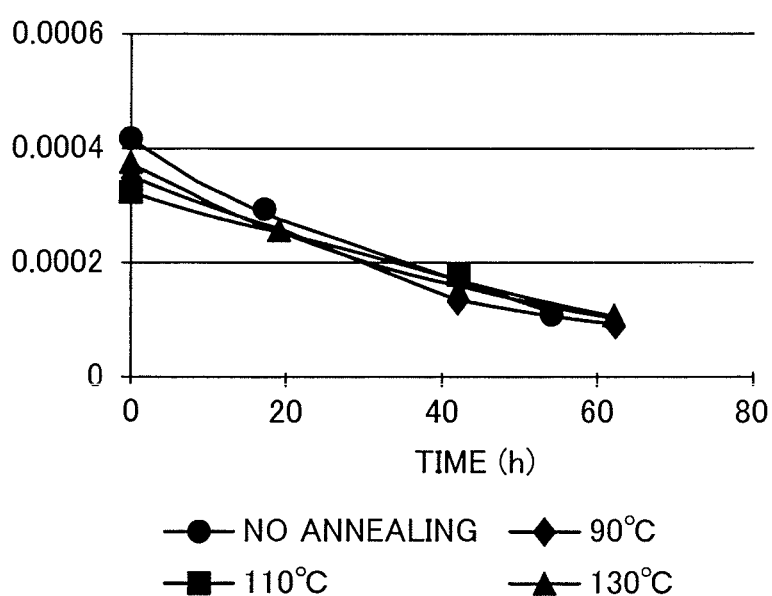
FIG. 28 is a graph illustrating a time variation in light emission intensity under each condition of sample 4-3 (red area)

FIG. 23 is a graph illustrating a time variation in light emission intensity of sample 4-1 (green area) under each condition. FIG. 24 is a graph illustrating a time variation in light emission intensity of sample 4-1 (red area) under each condition. FIG. 25 is a graph illustrating a time variation in light emission intensity of sample 4-2 (green area) under each condition. FIG. 26 is a graph illustrating a time variation in light emission intensity of sample 4-2 (red area) under each condition. FIG. 27 is a graph illustrating a time variation in light emission intensity of sample 4-3 (green area) under each condition. FIG. 28 is a graph illustrating a time variation in light emission intensity of sample 4-3 (red area) under each condition.

As shown in FIG. 24, FIG. 26 and FIG. 28, no significant differences were observed in red light emission. On the other hand, as shown in FIG. 23, FIG. 25 and FIG. 27, regarding green light emission, it has been appreciated that samples to which silica minute particles were added emitted light more hours than sample 4-1 to which no silica minute particles were added. Note that there was no significant change before and after the annealing in the reduction in the fluorescence area and no significant improvement was observed.

[Experiment of Dispersion State]

Figure 30:
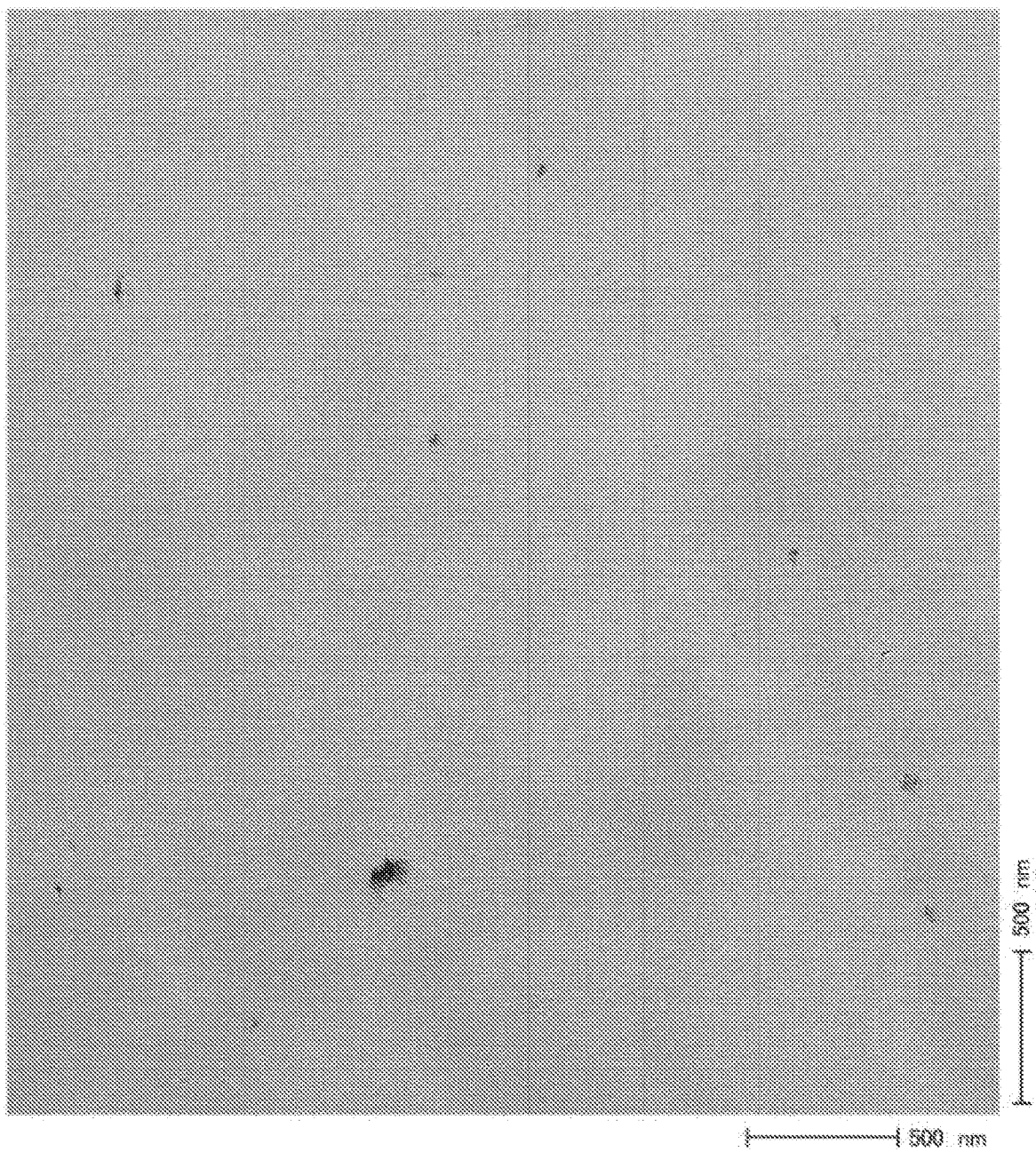
FIG. 30 is a TEM photograph of sample A.
Figure 31:
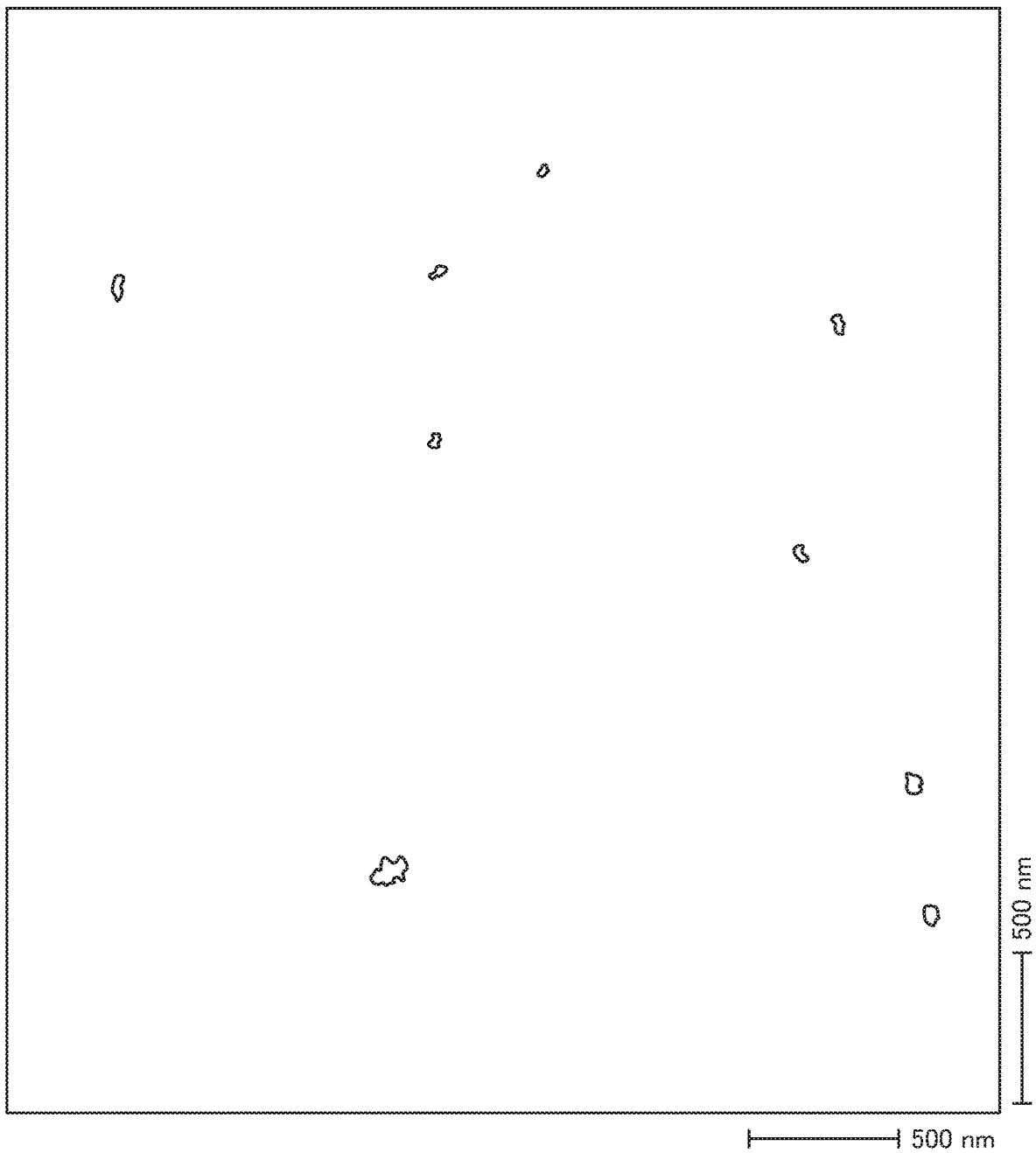
FIG. 31 is a schematic view of FIG. 30.
Figure 32:
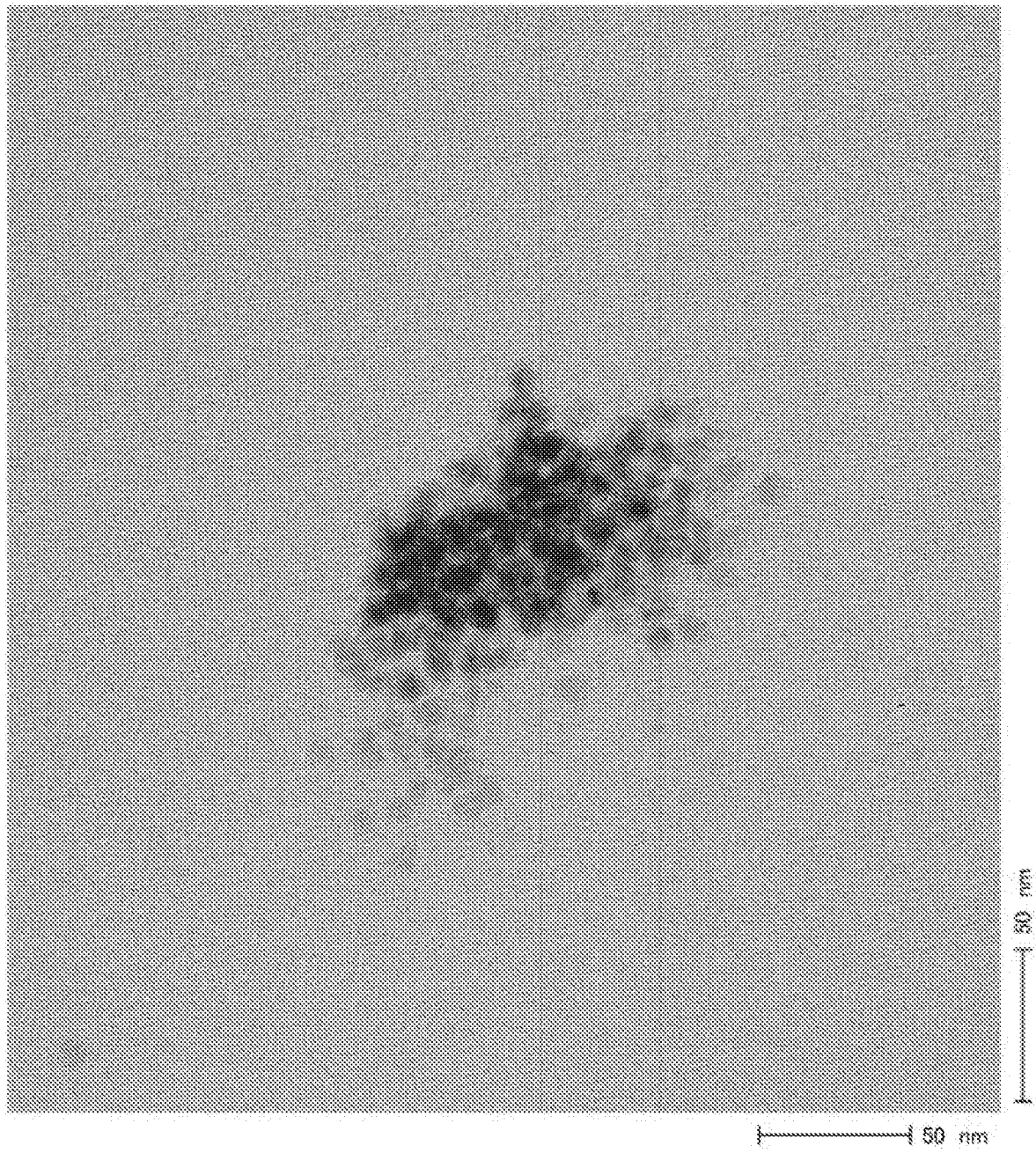
FIG. 32 is a TEM photograph which is an enlarged view of FIG. 30.
Figure 33:
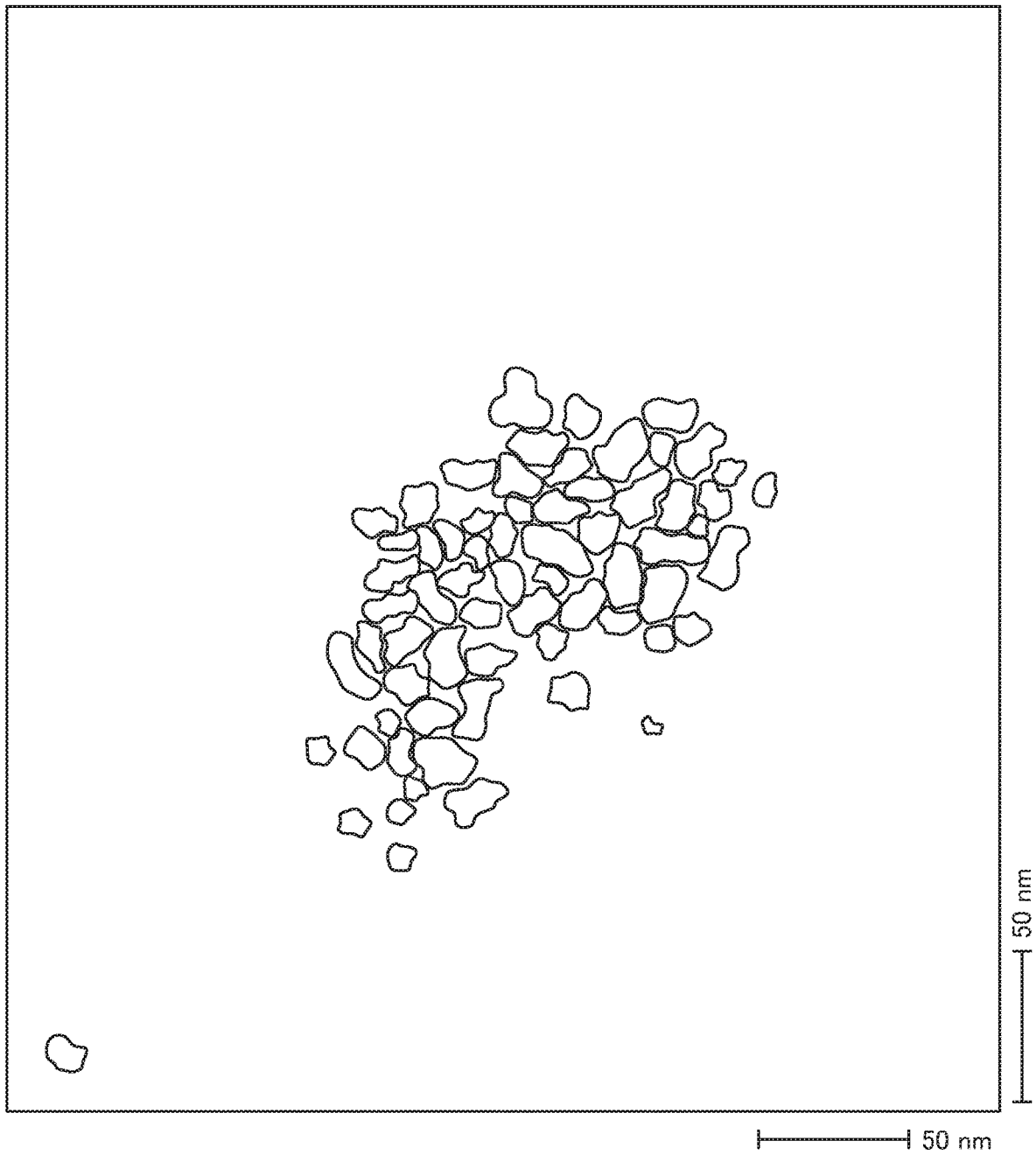
FIG. 33 is a schematic view of FIG. 32.

The dispersed state of quantum dots in resin was examined using sample A. Sample A was formed based on sample 1-1. Both FIG. 30 and FIG. 32 are TEM photographs. FIG. 32 is an enlarged view of the aggregate of quantum dots shown in FIG. 30. FIG. 31 is a schematic view of FIG. 30 and FIG. 33 is a schematic view of FIG. 32.

It has been proved from this experiment that a plurality of quantum dots form each aggregate and aggregates are dispersed in resin.

INDUSTRIAL APPLICABILITY

The resin molded product of the present invention is applicable to a light-guiding board for an LED light source, a backlight or the like, and an illumination device, a fluorescence member or the like.

The present application is based on Japanese Patent Application No. 2014-160299 filed on Aug. 6, 2014, entire content of which is expressly incorporated by reference herein.

The invention claimed is:

1. A method for manufacturing a resin molded product, for a backlight of a display, the resin molded product obtained by molding a resin composition in which quantum dots are dispersed, the method comprising:
   stirring resin and metal soap to form a resin mixture, wherein the metal soap is contained in the resin in a range of 1 ppm to 40,000 ppm with respect to the resin;
   obtaining a quantum dot liquid by dispersing the quantum dots in a solvent;
   obtaining a resin composition in a solid state by kneading the quantum dot liquid in the resin mixture, wherein a weight ratio of the metal soap to the quantum dots is within a range from 1/10:1 to 10:1; and
   forming a sheet-like shaped resin molded product by extrusion molding the resin composition in the solid state.

2. The method according to claim 1, wherein calcium stearate is used for the metal soap.

3. The method according to claim 1, wherein organosilane or hexane is used for the solvent.

4. The method according to claim 1, wherein a scattering agent is mixed into the quantum dot liquid.

5. The method according to claim 1, wherein the resin includes polypropylene.

6. The method according to claim 1, further comprising: mixing an elastomer with the resin mixture.

7. The method according to claim 4, wherein the scattering agent includes minute particles, the minute particles comprising one of $SiO_2$, BN, or AlN.

8. The method according to claim 1, wherein the quantum dots contain at least one of ZnCuInS, CdS, CdSe, ZnS, ZnSe, InP, or CdTe.

9. The method according to claim 1, wherein
   each quantum dot possesses a core-shell structure comprising a core and a shell,
   the shell of the core-shell structure comprises a first shell that covers a surface of the core, and a second shell that covers a surface of the first shell, thereby forming a multi-shell configuration, and
   a bandgap of the second shell is greater than a bandgap of the first shell.

10. The method according to claim 1, wherein
    in the obtaining of the resin composition, the metal soap wraps the quantum dots in the resin to improve dispersibility of the quantum dots.

11. A method, for a backlight of a display, the resin molded product obtained by molding a resin composition in which quantum dots are dispersed, the method comprising:
    stirring resin and metal soap to form a resin mixture, wherein the metal soap is contained in the resin in a range of 1 ppm to 40,000 ppm with respect to the resin;
    obtaining a quantum dot liquid by dispersing the quantum dots in a solvent;
    improving dispersibility of the quantum dots in the resin mixture by kneading the resin mixture and the quantum dot liquid to obtain a resin composition in a solid state, wherein a weight ratio of the metal soap to the quantum dots in the resin composition is within a range from 1/10:1 to 10:1; and
    forming a sheet-like shaped resin molded product by extrusion molding the resin composition in the solid state.

12. The method according to claim 11, wherein
    in the improving of the dispersibility of the quantum dots, the metal soap wraps the quantum dots in the resin to improve the dispersibility of the quantum dots.

13. The method according to claim 11, wherein
    the metal soap is calcium stearate.

* * * * *